(12) United States Patent
Chen et al.

(10) Patent No.: US 11,189,596 B2
(45) Date of Patent: Nov. 30, 2021

(54) METHODS OF FORMING MULTI-CHIP WAFER LEVEL PACKAGES

(71) Applicant: Taiwan Semiconductor Manufacturing Co., Ltd., Hsinchu (TW)

(72) Inventors: Shuo-Mao Chen, New Taipei (TW); Feng-Cheng Hsu, New Taipei (TW); Han-Hsiang Huang, Pingtung County (TW); Hsien-Wen Liu, Hsinchu (TW); Shin-Puu Jeng, Hsinchu (TW); Hsiao-Wen Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/928,003

(22) Filed: Jul. 14, 2020

(65) Prior Publication Data
US 2020/0343220 A1 Oct. 29, 2020

Related U.S. Application Data

(62) Division of application No. 15/795,276, filed on Oct. 27, 2017, now Pat. No. 10,763,239.

(51) Int. Cl.
| | |
|---|---|
| *H01L 25/065* | (2006.01) |
| *H01L 25/16* | (2006.01) |
| *H01L 23/538* | (2006.01) |
| *H01L 25/00* | (2006.01) |
| *H01L 21/56* | (2006.01) |

(Continued)

(52) U.S. Cl.
CPC ........ *H01L 25/0652* (2013.01); *H01L 21/568* (2013.01); *H01L 21/6835* (2013.01); *H01L 23/5383* (2013.01); *H01L 25/16* (2013.01); *H01L 25/50* (2013.01); *H01L 23/3128* (2013.01); *H01L 2221/68345* (2013.01);
(Continued)

(58) Field of Classification Search
CPC ............... H01L 21/568; H01L 21/6835; H01L 2221/68345; H01L 2221/68359
See application file for complete search history.

(56) References Cited

U.S. PATENT DOCUMENTS

| | | | |
|---|---|---|---|
| 2015/0303174 A1* | 10/2015 | Yu | ........................ H01L 21/6835 257/712 |
| 2016/0307872 A1* | 10/2016 | Chen | ................... H01L 23/3135 |

(Continued)

OTHER PUBLICATIONS

"Office Action of Taiwan Counterpart Application", dated May 4, 2021, pp. 1-4.

*Primary Examiner* — Peniel M Gumedzoe
(74) *Attorney, Agent, or Firm* — JCIPRNET

(57) ABSTRACT

Multi-chip wafer level packages and methods of forming the same are provided. A multi-chip wafer level package includes a first tier and a second tier. The first tier includes a first redistribution layer structure and at least one chip over the first redistribution layer structure. The second tier includes a second redistribution layer structure and at least two other chips over the second redistribution layer structure. The first tier is bonded to the second tier with the at least one chip being in physical contact with the second redistribution layer structure. The total number of connectors of the at least two other chips is greater than the total number of connectors of the at least one chip.

20 Claims, 30 Drawing Sheets

(51) Int. Cl.
 *H01L 21/683* (2006.01)
 *H01L 23/31* (2006.01)
(52) U.S. Cl.
 CPC ............ *H01L 2221/68359* (2013.01); *H01L 2225/06517* (2013.01); *H01L 2225/06548* (2013.01)

(56) References Cited

U.S. PATENT DOCUMENTS

2016/0343685 A1 11/2016 Lin et al.
2017/0098629 A1 4/2017 Liu et al.
2017/0243826 A1 8/2017 Lin et al.

\* cited by examiner

US 11,189,596 B2

METHODS OF FORMING MULTI-CHIP WAFER LEVEL PACKAGES

CROSS-REFERENCE

This application is a divisional application of and claims the priority benefit of U.S. patent application Ser. No. 15/795,276, filed on Oct. 27, 2017, now allowed. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of types of packages for semiconductors include quad flat packages (QFP), pin grid array (PGA) packages, ball grid array (BGA) packages, flip chips (FC), three-dimensional integrated circuits (3DICs), wafer level packages (WLPs), and package on package (PoP) devices, etc. A multi-chip wafer level package has emerged to further reduce the physical size of a package. However, there are many challenges related to such multi-chip wafer level package.

DETAILED DESCRIPTION

Figure 1A:
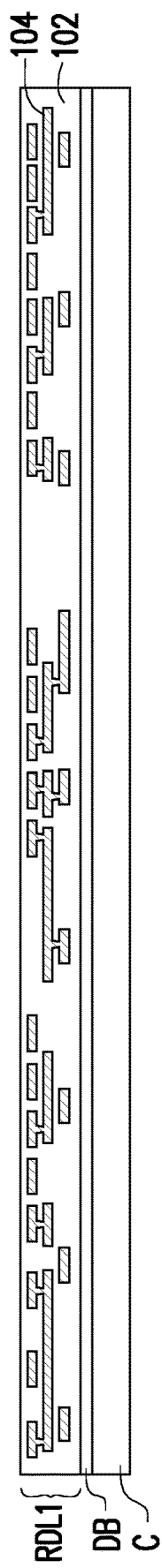
FIG. 1A to FIG. 1G are cross-sectional views of a method of forming a multi-chip wafer level package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views of a method of forming a multi-chip wafer level package in accordance with some embodiments.

Referring to FIG. 1A, a carrier C is provided with a first redistribution layer structure RDL1 formed thereon. In some embodiments, a debonding layer DB is formed between the carrier C and the first redistribution layer structure RDL1. In some embodiments, the carrier C is a non-semiconductor material, such as a glass carrier, a ceramic carrier, or the like. In some embodiments, the debonding layer DB includes an Ultra-Violet (UV) glue, a Light-to-Heat Conversion (LTHC) glue, or the like, although other types of adhesives may be used. The debonding layer DB is decomposable under the heat of light to thereby release the carrier C from the structure formed thereon.

In some embodiments, the first redistribution layer structure RDL1 is referred to as a "backside redistribution layer structure" through the specification. In some embodiments, the first redistribution layer structure RDL1 includes a plurality of redistribution layers 104 embedded by a plurality of polymer layers 102. In some embodiments, each of the redistribution layers 104 includes copper, nickel, titanium, a combination thereof, or the like, and is formed by photolithography, plating, and photoresist stripping processes. In some embodiments, each of the polymer layers 102 includes a polymer material such as polybenzoxazole (PBO), polyimide (PI), benzocyclobutene (BCB), a combination thereof or the like, and is formed by a suitable fabrication technique such as spin-coating, lamination, deposition or the like.

Figure 1B:
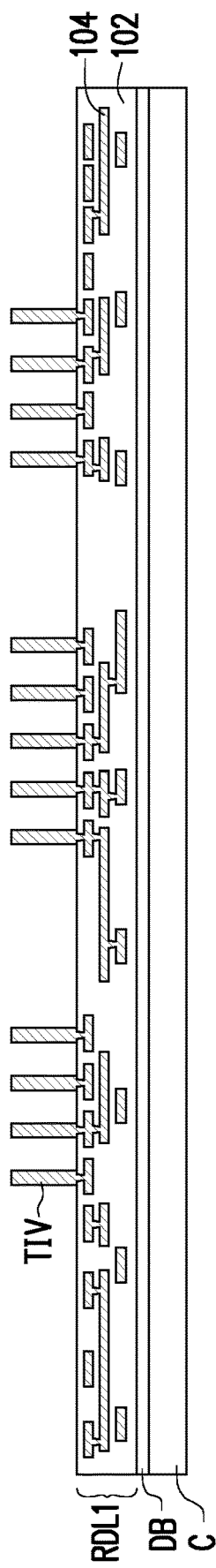

Referring to FIG. 1B, a plurality of through integrated fan-out vias TIV are formed on the first redistribution layer structure RDL1. In some embodiments, the through integrated fan-out vias TIV extend into the uppermost polymer layer 102 and are electrically connected to the uppermost redistribution layer 104. In some embodiments, the through integrated fan-out vias TIV include copper, nickel, titanium, a combination thereof, or the like, and are formed by photolithography, plating, and photoresist stripping processes.

Figure 1C:
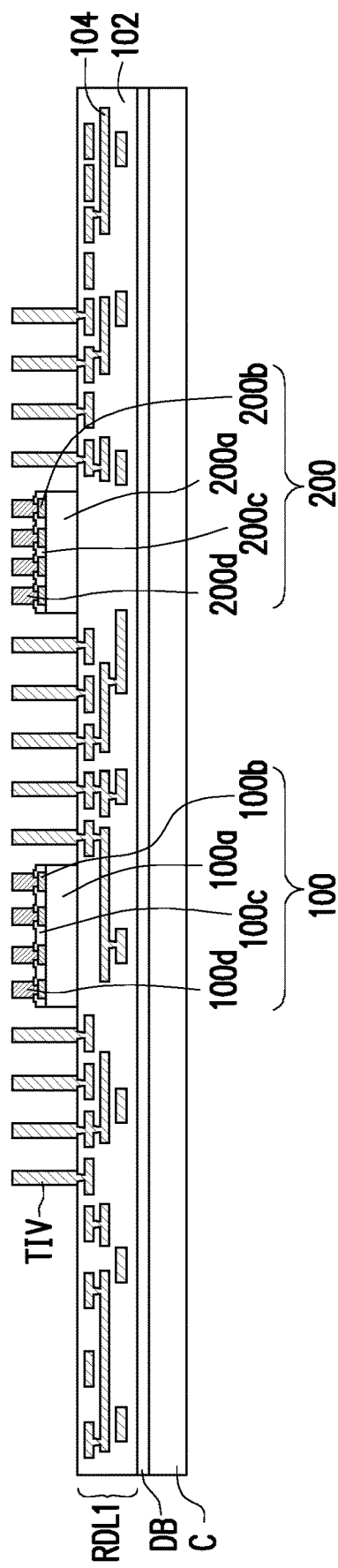

Referring to FIG. 1C, a first semiconductor chip 100 and a second semiconductor chip 200 are placed on and bonded to a first side of the first redistribution layer structure RDL1.

In some embodiments, the first semiconductor chip 100 includes a substrate 100a, one or more pads 100b, a passivation layer 100c and one or more connectors 100d. The substrate 100a includes, for example but not limited to, bulk silicon, doped or undoped, or an active layer of a semiconductor-on-insulator (SOI) substrate. The pads 100b are formed over the substrate 100a, and the passivation layer 100c is formed over the pads 100b. In some embodiments, the pads 100b are aluminum pads, and the passivation layer 100c includes a polymer material such as polybenzoxazole (PBO), polyimide, benzocyclobutene (BCB), a combination thereof, or the like. The connectors 100d are formed through the passivation layer 100c and electrically connected to underlying pads 100b or an interconnection structure. In some embodiments, the connectors 100d are formed as the top portions of the first semiconductor chip 100. The connectors 100d protrude from the remaining portions or lower portions of the first semiconductor chip 100. Throughout the description, the sides of the first semiconductor chip 100 with the connectors 100d are referred to as front sides. The connectors 100d may include Cu, W, Ni, Sn, Ti, Au, an alloy or a combination thereof, and are formed with a ball drop process or an electroplating process. In some embodiments, the pads 100b constitute parts of the connectors of the first semiconductor chip 100. In some embodiments, the pads 100b and/or the connectors 100d constitute the front-side connectors of the first semiconductor chip 100.

In some embodiments, the second semiconductor chip 200 includes a substrate 200a, one or more pads 200b, a passivation layer 200c and one or more connectors 200d. The materials and arrangements of other elements of the second semiconductor chip 200 are similar to those of the first semiconductor chip 100, so the details are not iterated herein.

Figure 15:
FIG. 15 to FIG. 16 are cross-sectional views of semiconductor chips in accordance with some embodiments.

In some embodiments, each of the first and second semiconductor chips 100 and 200 includes an integrated passive device, such as a capacitor, an inductor or a resistor. In some embodiments, the first and second semiconductor chips 100 and 200 are referred to as "first and second integrated passive device chips" through the specification. In some embodiments, each of the first and second semiconductor chips 100 and 200 is a capacitor configured to operate at a high frequency of about 1 GHz or more. In some embodiments, the first and second semiconductor chips 100 and 200 are referred to as "high frequency capacitors" through the specification. In some embodiments, upon the process requirements, the first and second semiconductor chips 100 and 200 are capacitors having different capacitance values, resonance frequencies, and/or different sizes. Specifically, as shown in FIG. 15, the first semiconductor chip 100' further has a deep trench capacitor region CA1 between the substrate 100a and the pads 100b, and the second semiconductor chip 200' further has a deep trench capacitor region CA2 between the substrate 200a and the pads 200b. However, the disclosure is not limited thereto. In alternative embodiments, the first and second semiconductor chips 100 and 200 are designed to have the same size, function and/or operation range as needed.

Figure 1D:
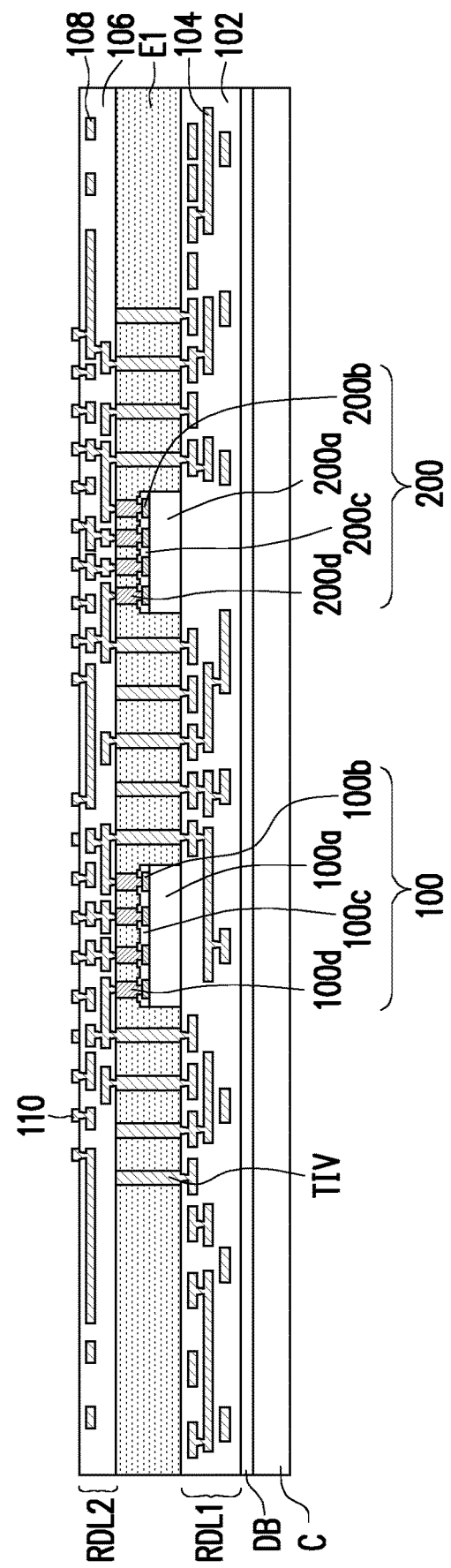

Referring to FIG. 1D, the first and second semiconductor chips 100 and 200 are encapsulated with a first encapsulation layer E1. In some embodiments, the first encapsulation layer E1 is formed over the carrier C to encapsulate or surround the sidewalls of the through integrated fan-out vias TIV and the sidewalls of the first and second semiconductor chips 100 and 200. In some embodiments, the first encapsulation layer E1 includes a molding compound, a molding underfill, a resin or the like, such as epoxy. In some embodiments, the first encapsulation layer E1 includes a polymer material such as polybenzoxazole (PBO), polyimide, benzocyclobutene (BCB), a combination thereof, or the like, and is formed by a molding process followed by a grinding process until surfaces of the through integrated fan-out vias TIV and surfaces of the connectors 100d and 200d of the first and second semiconductor chips 100 and 200 are exposed.

Thereafter, a second redistribution layer structure RDL2 is formed over the first encapsulation layer E1. In some embodiments, the second redistribution layer structure RDL2 is referred to as a "front-side redistribution layer structure" through the specification. In some embodiments, the second redistribution layer structure RDL2 includes a plurality of redistribution layers 108 embedded by a plurality of polymer layers 106. In some embodiments, each of the redistribution layers 108 includes copper, nickel, titanium, a combination thereof, or the like, and is formed by photolithography, plating, and photoresist stripping processes. In some embodiments, each of the polymer layers 106 includes a polymer material such as polybenzoxazole (PBO), polyimide (PI), benzocyclobutene (BCB), a combination thereof or the like, and is formed by a suitable fabrication technique such as spin-coating, lamination, deposition or the like. In some embodiments, the second redistribution layer structure RDL2 further includes a plurality of connecting pads 110 configured to connect to other semiconductor chips.

In some embodiments, the critical dimension of the second redistribution layer structure RDL2 is less than the critical dimension of the first redistribution layer structure RDL1. In alternative embodiments, the critical dimension of the second redistribution layer structure RDL2 can be substantially the same as or greater than the critical dimension of the first redistribution layer structure RDL1 as needed.

Figure 1E:
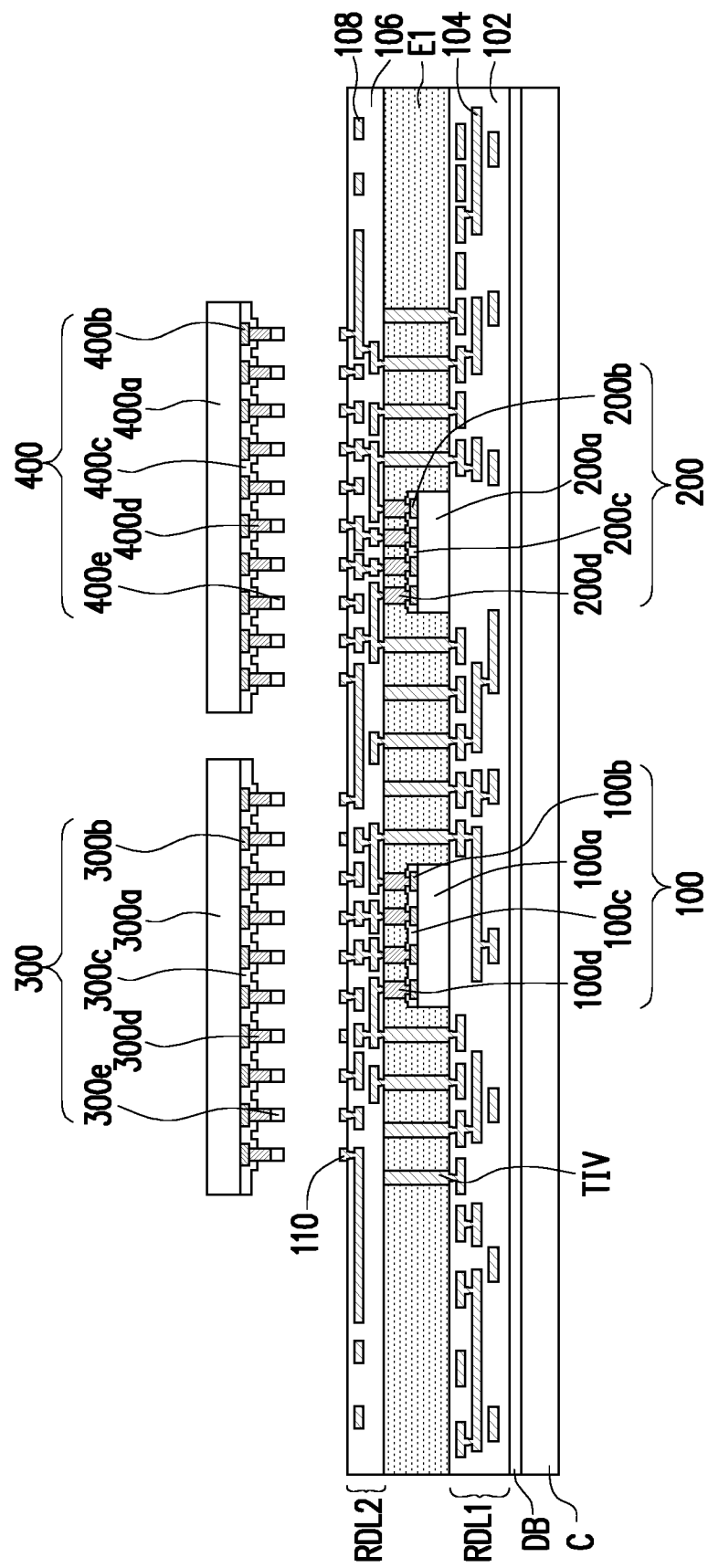
Figure 1F:
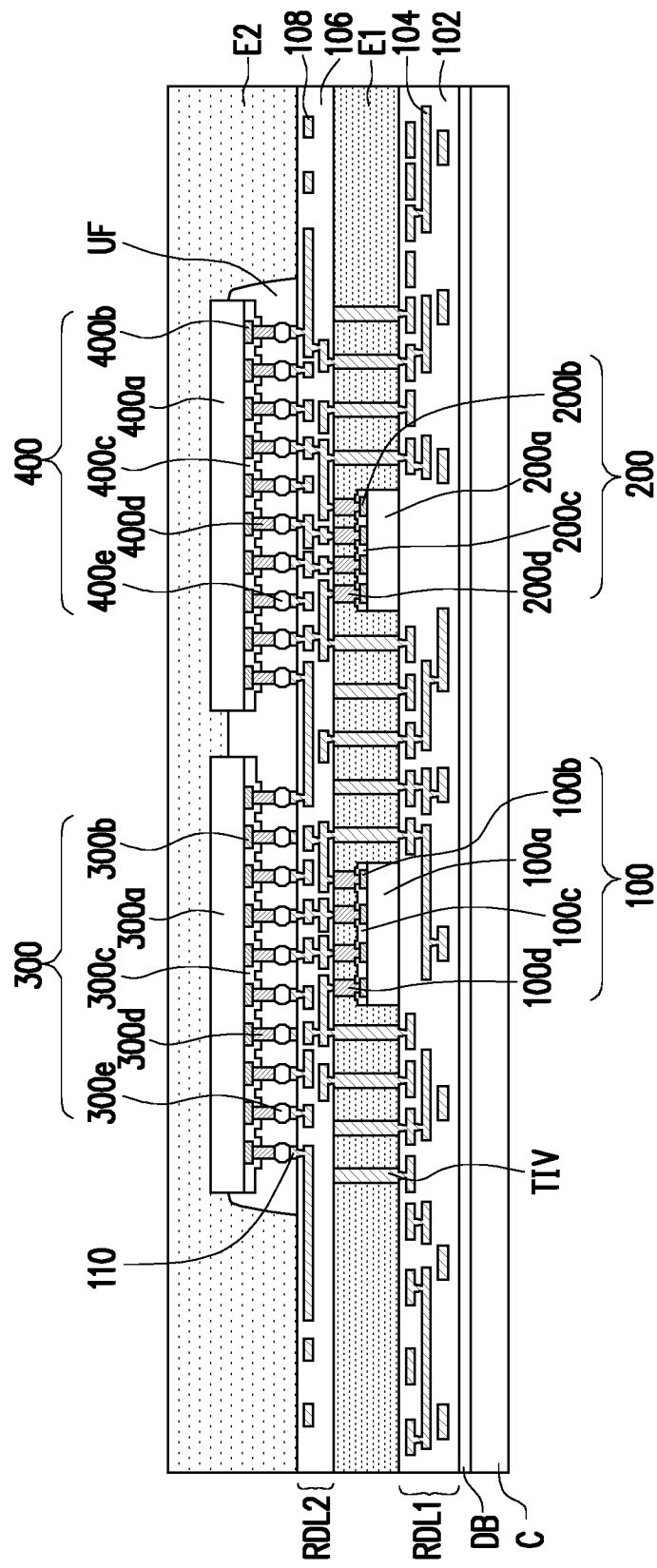

Referring to FIG. 1E and FIG. 1F, a third semiconductor chip 300 and a fourth semiconductor chip 400 are placed on and bonded to the second redistribution layer structure RDL2.

As shown in FIG. 1E, the third semiconductor chip 300 and the fourth semiconductor chip 400 are provided. In some embodiments, the third semiconductor chip 300 includes a substrate 300a, one or more pads 300b, a passivation layer 300c, one or more connectors 300d, and one or more bumps 300e. The substrate 300a includes, for example but not limited to, bulk silicon, doped or undoped, or an active layer of a semiconductor-on-insulator (SOI) substrate. The pads 300b are formed over the substrate 300a, and the passivation layer 300c is formed over the pads 300b. In some embodiments, the pads 300b are aluminum pads, and the passivation layer 300c includes a polymer material such as polybenzoxazole (PBO), polyimide, benzocyclobutene (BCB), a combination thereof, or the like. The connectors 300d are formed through the passivation layer 300c and electrically connected to underlying pads 300b or an interconnection structure. In some embodiments, the connectors 300d are formed as the top portions of the third semiconductor chip 300. The connectors 300d protrude from the remaining portions or lower portions of the third semiconductor chip 300. Throughout the description, the sides of the third semiconductor chip 300 with the connectors 300d are referred to as front sides. The connectors 300d may include copper-containing pillars, and are formed with an electroplating process. The bumps 300e are formed on the connectors 300d. In some embodiments, the bumps 300e may include solder bumps, and are formed with a ball drop process or an electroplating process. In some embodiments, the pads 300b and/or the bumps 300e constitute parts of the connectors of the third semiconductor chip 300. In some embodiments, the pads 300b, the connectors 300d and/or the bumps 300e constitute the front-side connectors of the third semiconductor chip 300.

In some embodiments, the fourth semiconductor chip 400 includes a substrate 400a, one or more pads 400b, a passivation layer 400c, one or more connectors 400d and one or more bumps 400e. The materials and element arrangements of the fourth semiconductor chip 400 are similar to those of the third semiconductor chip 300, so the details are not iterated herein.

In some embodiments, each of the third and fourth semiconductor chips 300 and 400 includes an integrated active device, such as a logic device. The logic device includes an application processor (AP), a system on chip (SoC) or the like. In some embodiments, the system on chip (SoC) includes a modem module. Other types of active devices such as memory devices, MOSFET devices, CMOS devices and/or BJT devices may be used upon the process requirements. In some embodiments, the third and fourth semiconductor chips 300 and 400 are referred to as "first and second integrated active device chips" through the specification. In some embodiments, the third and fourth semiconductor chips 300 and 400 are active devices having different functions and/or different sizes. In alternative embodiments, the third and fourth semiconductor chips 300 and 400 are designed to have the same size and/or function as needed. In some embodiments, at least one of third semiconductor chip 300 or fourth semiconductor chip 400 is electrically connected to six or more integrated passive device chips to form a multiple chip module. In comparison with other approaches, such arrangement helps to increase the bandwidth of products as well as reducing the packaging size.

As shown in FIG. 1F, the third and fourth semiconductor chips 300 and 400 are bonded to the second redistribution layer structure RDL2 and located above the first and second semiconductor chips 100 and 200. In some embodiments, the bumps 300e and 400e of the third and fourth semiconductor chips 300 and 400 are bonded to the connecting pads 110 of the second redistribution layer structure RDL2.

In some embodiments, the total number of the connectors 300d of the third semiconductor chip 300 and the connectors 400d of the fourth semiconductor chip 400 is greater than (e.g., at least two times, at least five times or at least eight times) the total number of the connectors 100d of the first semiconductor chip 100 and the connectors 200d of the second semiconductor chip 200.

Thereafter, an underfill layer UF is formed to fill the space between the second redistribution layer structure RDL2 and each of the third and fourth semiconductor chips 300 and 400. In some embodiments, the underfill layer UF is formed to surround the connectors 300d and 400d and the bumps 300e and 400e. In some embodiments, the underfill layer UF includes a molding compound such as epoxy, and is formed using dispensing, injecting, and/or spraying techniques.

Afterwards, the third and fourth semiconductor chips 300 and 400 are encapsulated with a second encapsulation layer E2. In some embodiments, the second encapsulation layer E2 is formed over the second redistribution layer structure RDL2 to encapsulate or surround the sidewalls and tops of the third and fourth semiconductor chips 300 and 400. In some embodiments, the second encapsulation layer E2 includes a molding compound, a molding underfill, a resin or the like, such as epoxy. In some embodiments, the second encapsulation layer E2 includes a polymer material such as polybenzoxazole (PBO), polyimide, benzocyclobutene (BCB), a combination thereof, or the like, and is formed by a molding process. In some embodiments, the first and second encapsulation layers E1 and E2 include the same material. In alternative embodiments, the second encapsulation layer E2 includes a material different from that of the first encapsulation layer E1.

Figure 1G:
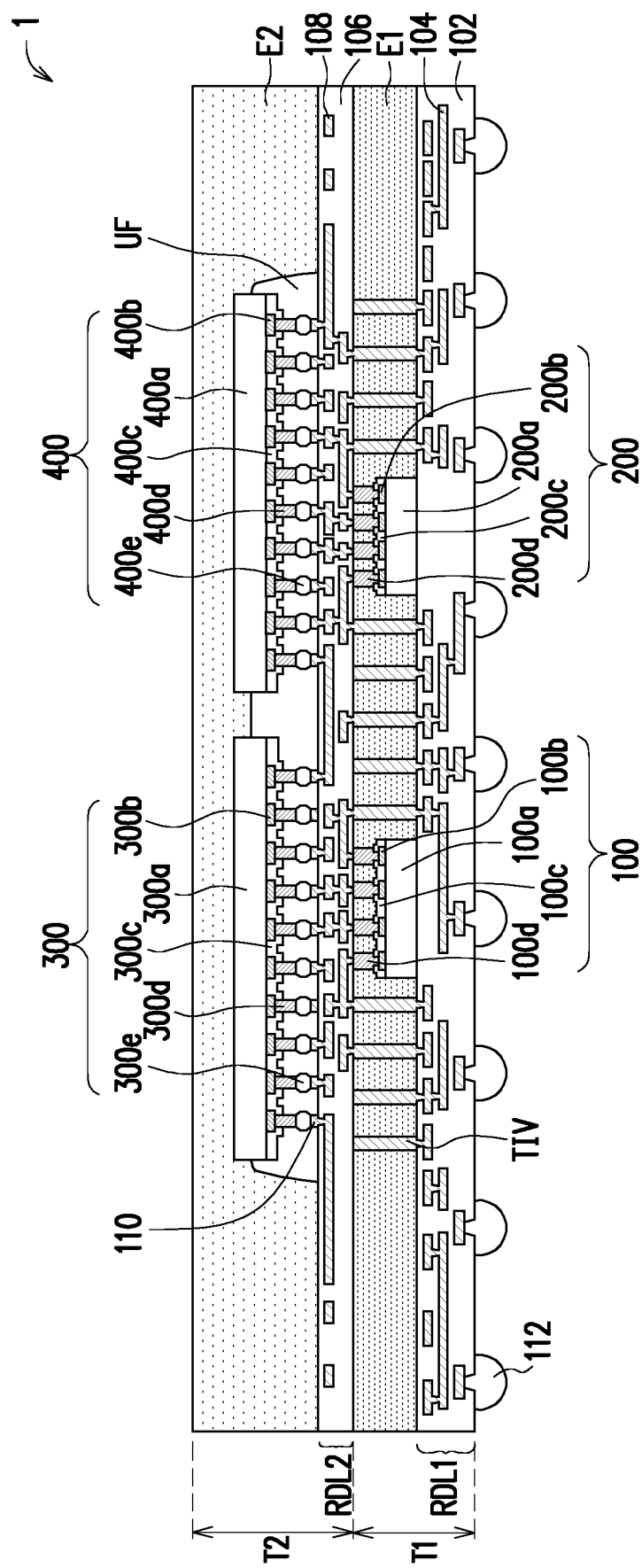

Referring to FIG. 1G, the carrier C is debonded from a second side of the first redistribution layer structure RDL1. In some embodiments, the debonding layer DB is decomposed under heat of light, and the carrier C is then released from the structure formed thereon.

Thereafter, the lowermost polymer layer 102 is patterned such that openings are formed to expose the connecting pads or the lowermost redistribution layer 104 of the first redistribution layer structure RDL1. In some embodiments, the openings are formed by a laser drilling process, a dry etching process or a suitable patterning process. Thereafter, bumps 112 are placed over the second side of the first redistribution layer structure RDL1 and bonded to the connecting pads of the first redistribution layer structure RDL1. In some embodiments, the bumps 112 may be solder bumps, and/or may include metal pillars (e.g., copper pillars), solder caps formed on metal pillars, and/or the like. The bumps 112 may be formed by a suitable process such as evaporation, electroplating, ball drop, or screen printing. A multi-chip wafer level package 1 is thus completed. In some embodiments, the multi-chip wafer level package 1 is constituted by a first tier T1 and a second tier T2 in physical contact with each other. In some embodiments, the first tier T1 includes the first redistribution layer structure RDL1 and the first and second semiconductor chips 100 and 200 thereon, and the second tier T2 includes the second redistribution layer structure RDL2 and the third and fourth semiconductor chips 300 and 400 thereon.

In some embodiments, the first and second semiconductor chips 100 and 200 are decoupling capacitors configured to keep the level voltages of the third and fourth semiconductor chips 300 and 400 relatively stable. Specifically, during the operation of circuits, the power supply lines supply transient currents with a relatively high intensity, which can result in voltage fluctuations on the power supply lines. Such issue is not observed in the disclosure. In some embodiments, the decoupling capacitors (e.g., the first and second semiconductor chips 100 and 200) are disposed close to (e.g., correspondingly below) the active devices (e.g., the third and fourth semiconductor chips 300 and 400), and act as charge reservoirs that additionally supply currents to the active devices to prevent momentary drops in supply voltage. In some embodiments, due to the disposition of the decoupling capacitors (e.g., the first and second semiconductor chips 100 and 200), the TIV number can be reduced and therefore the TIV pitch can be increased. The pattern pitch of the first redistribution layer structure RDL1 can be accordingly increased. Therefore, the process window can be broadened and the production cost can be saved.

Possible modifications and alterations can be made to the multi-chip wafer level packages. These modifications and alterations are provided for illustration purposes, and are not construed as limiting the present disclosure. FIG. 2 to FIG. 6 are cross-sectional views of multi-chip wafer level packages in accordance with some embodiments.

Figure 2:
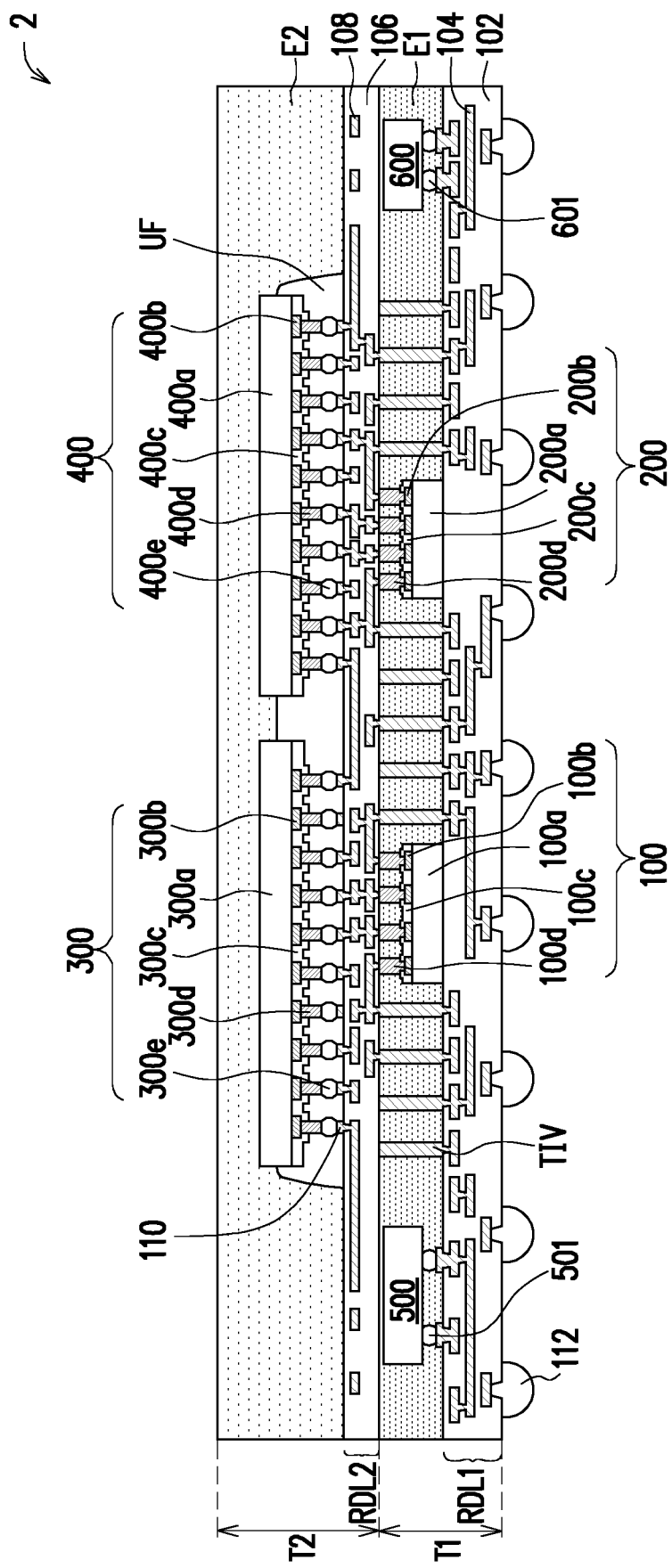
FIG. 2 to FIG. 6 are cross-sectional views of multi-chip wafer level packages in accordance with some embodiments.

The multi-chip wafer level package 2 of FIG. 2 is similar to the multi-chip wafer level package 1 of FIG. 1G, and the difference between them lies in that, the multi-chip wafer level package 2 further includes a fifth semiconductor chip 500 and a sixth semiconductor chip 600. In some embodiments, each of the fifth and sixth semiconductor chips 500 and 600 includes an integrated passive device, such as a capacitor, an inductor or a resistor. In some embodiments, the fifth and sixth semiconductor chips 500 and 600 are referred to as "third and fourth integrated passive device chips" through the specification. In some embodiments, each of the fifth and sixth semiconductor chips 500 and 600 is a capacitor configured to operate at a low frequency of about 1 KHz or less. In some embodiments, the fifth and sixth semiconductor chips 500 and 600 are referred to as "low frequency capacitors" through the specification. In some embodiments, upon the process requirements, the fifth and sixth semiconductor chips 500 and 600 are capacitors having different capacitance values, resonance frequencies, and/or different sizes. In alternative embodiments, the fifth and sixth semiconductor chips 500 and 600 are designed to have the same size, function and/or operation range as needed. In some embodiments, when the first and second semiconductor chips 100 and 200 are placed on and bonded to the first redistribution layer structure RDL1, the fifth and sixth semiconductor chips 500 and 600 are placed on and bonded to the first redistribution layer structure RDL1 through the bumps 501 and 601 thereof.

Figure 3:
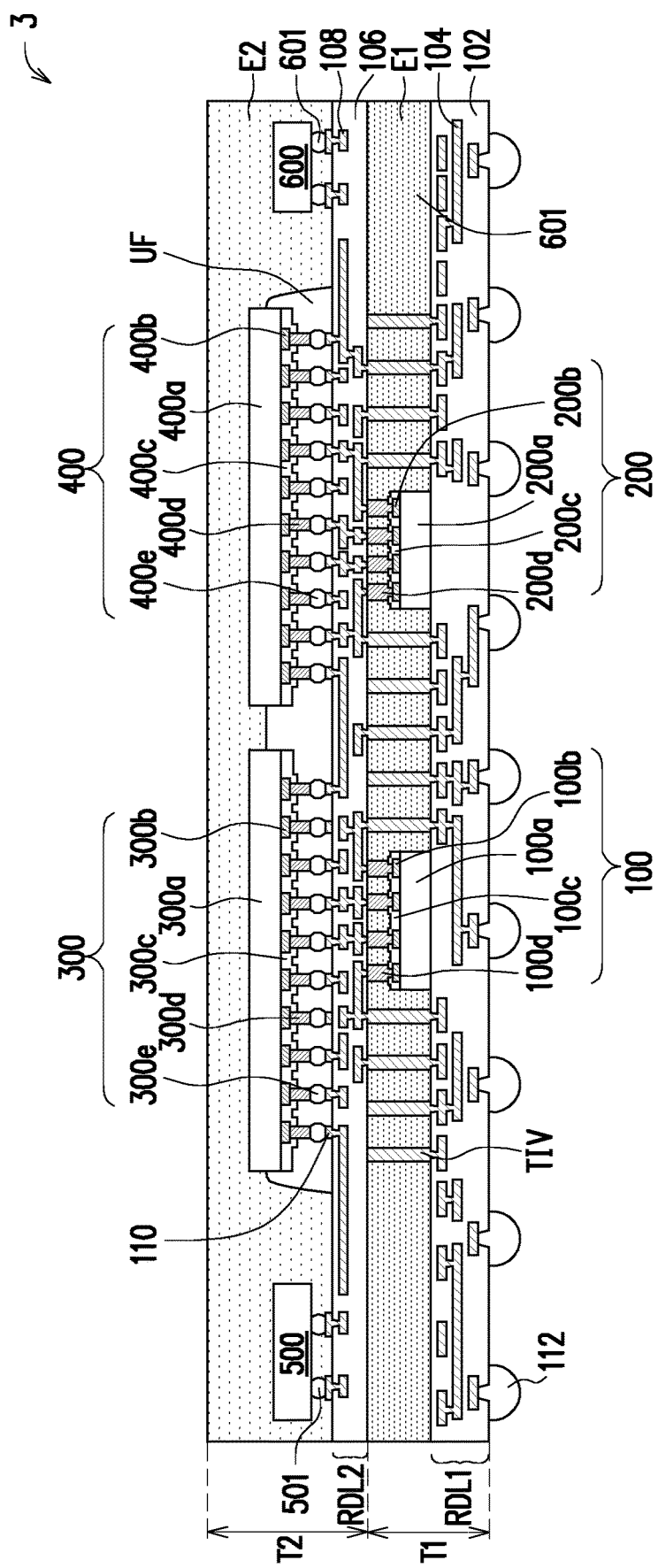

The multi-chip wafer level package 3 of FIG. 3 is similar to the multi-chip wafer level package 2 of FIG. 2, and the difference between them lies in that, the fifth and sixth semiconductor chips 500 and 600 in FIG. 2 are bonded to the first redistribution layer structure RDL1, while the fifth and sixth semiconductor chips 500 and 600 in FIG. 3 are bonded to the second redistribution layer structure RDL2. In some embodiments, when the third and fourth semiconductor chips 300 and 400 are placed on and bonded to the second redistribution layer structure RDL2, the fifth and sixth semiconductor chips 500 and 600 are placed on and bonded to the second redistribution layer structure RDL2 through the bumps 501 and 601 thereof.

Figure 4:
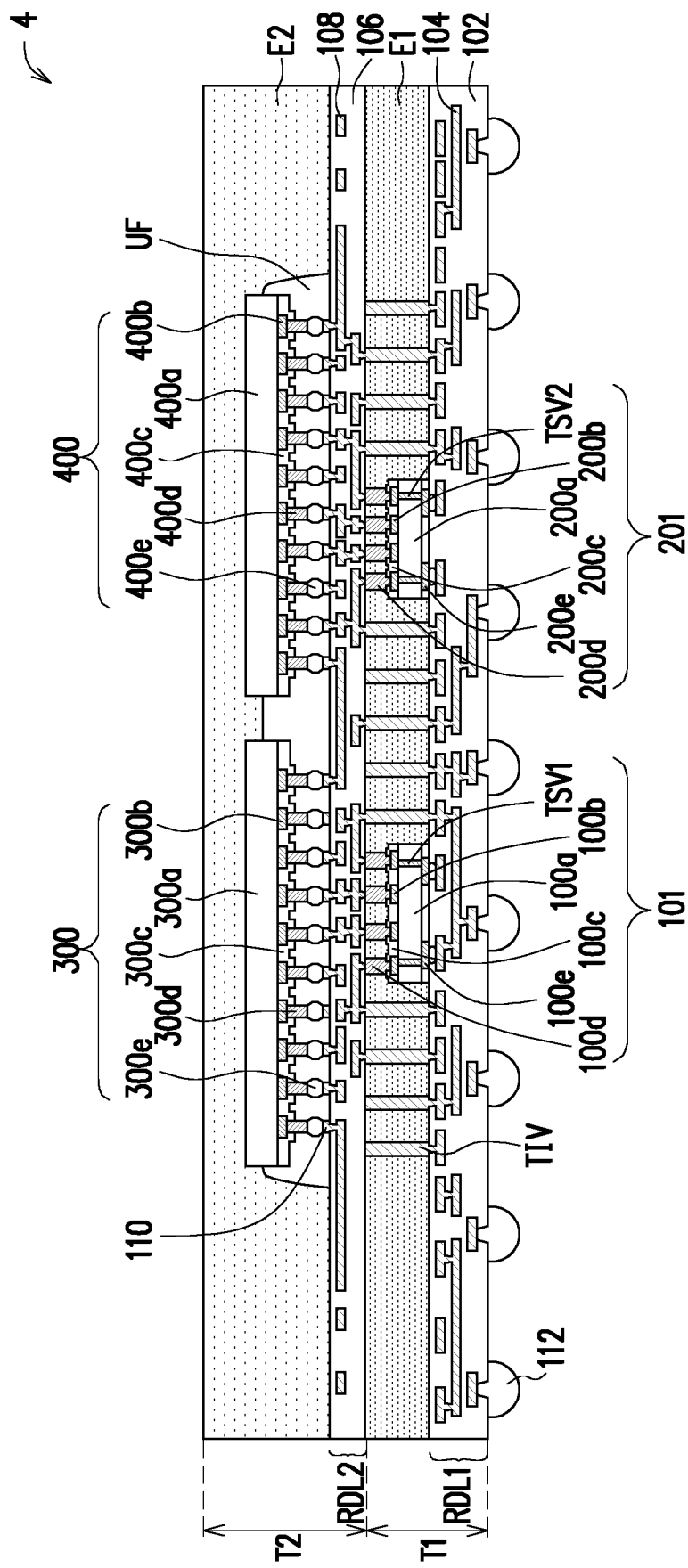

The multi-chip wafer level package 4 of FIG. 4 is similar to the multi-chip wafer level package 1 of FIG. 1G, and the difference between them lies in that, each of the first and second semiconductor chips 100 and 200 in FIG. 1G is a single-sided semiconductor chip with connectors 100a and 200a at a single side and bonded to the second redistribution layer structure RDL2, while each of the first and second semiconductor chips 101 and 201 in FIG. 4 is a double-sided semiconductor chip with connectors at opposite sides and respectively bonded to the first and second redistribution layer structures RDL1 and RDL2.

In some embodiments, the first semiconductor chip 101 is similar to the first semiconductor chip 100, and the difference between them lies in that, the first semiconductor chip 101 further includes one or more pads 100e in a backside portion thereof and one or more through silicon vias TSV1 between and electrically connected to the front-side pads 100b and the backside pads 100e. In some embodiments, the backside pads 100e are embedded by a polymer material such as polybenzoxazole (PBO), polyimide (PI), benzocyclobutene (BCB), a combination thereof or the like. In some embodiments, bumps are formed at the backside of the first semiconductor chip 101 and bonded to the pads 100e. In alternative embodiments, the backside pads 100e are connected to the first redistribution layer structure RDL1 without bumps therebetween. In some embodiments, the bottom surface of the first semiconductor chip is not coplanar with the top surface of the first redistribution layer structure RDL1. For example, the bumps are inserted into the top polymer layer of the first redistribution layer structure RDL1. In alternative embodiments, the bottom surface of the first semiconductor chip is coplanar with the top surface of the first redistribution layer structure RDL1. In some embodiments, the pads 100b and/or the connectors 100d constitute the front-side connectors of the first semiconductor chip 100, and the pads 100e and/or optional bumps constitute the backside connectors of the first semiconductor chip 100.

In some embodiments, the second semiconductor chip 201 is similar to the second semiconductor chip 200, and the difference between them lies in that, the second semiconductor chip 201 further includes one or more pads 200e in a backside portion thereof and one or more through silicon vias TSV2 between and electrically connected to the front-side pads 200b and the backside pads 200e. The materials and arrangements of other elements of the second semiconductor chip 201 are similar to those of the first semiconductor chip 101, so the details are not iterated herein.

Figure 16:
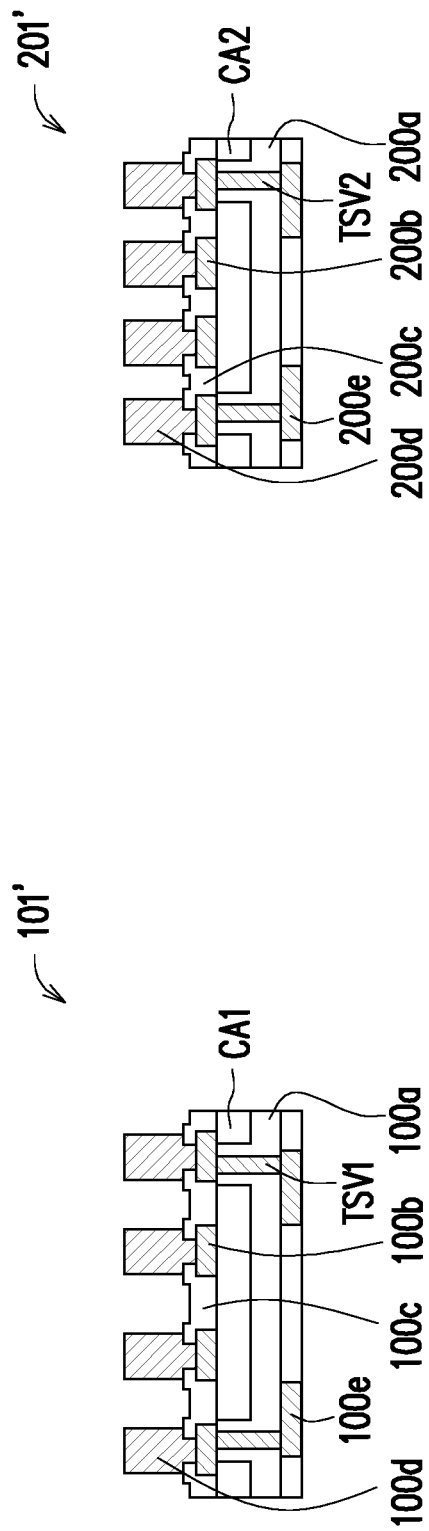

In some embodiments, each of the first and second semiconductor chips 101 and 201 includes an integrated passive device, such as a capacitor, an inductor or a resistor. In some embodiments, each of the first and second semiconductor chips 101 and 201 is a capacitor configured to operate at a high frequency of about 1 GHz or more. In some embodiments, the first and second semiconductor chips 101 and 201 are referred to as "high frequency capacitors" through the specification. In some embodiments, upon the process requirements, the first and second semiconductor chips 101 and 201 are capacitors having different capacitance values, resonance frequencies, and/or different sizes. Specifically, as shown in FIG. 16, the first semiconductor chip 101' further has a deep trench capacitor region CA1 that is between the substrate 100a and the pads 100b and is separated from the through silicon vias TSV1 by a keep out zone (KOZ). Similarly, the second semiconductor chip 201' further has a deep trench capacitor region CA2 that is between the substrate 200a and the pads 200b and is separated from the through silicon vias TSV2 by a keep out zone (KOZ).

Figure 5:
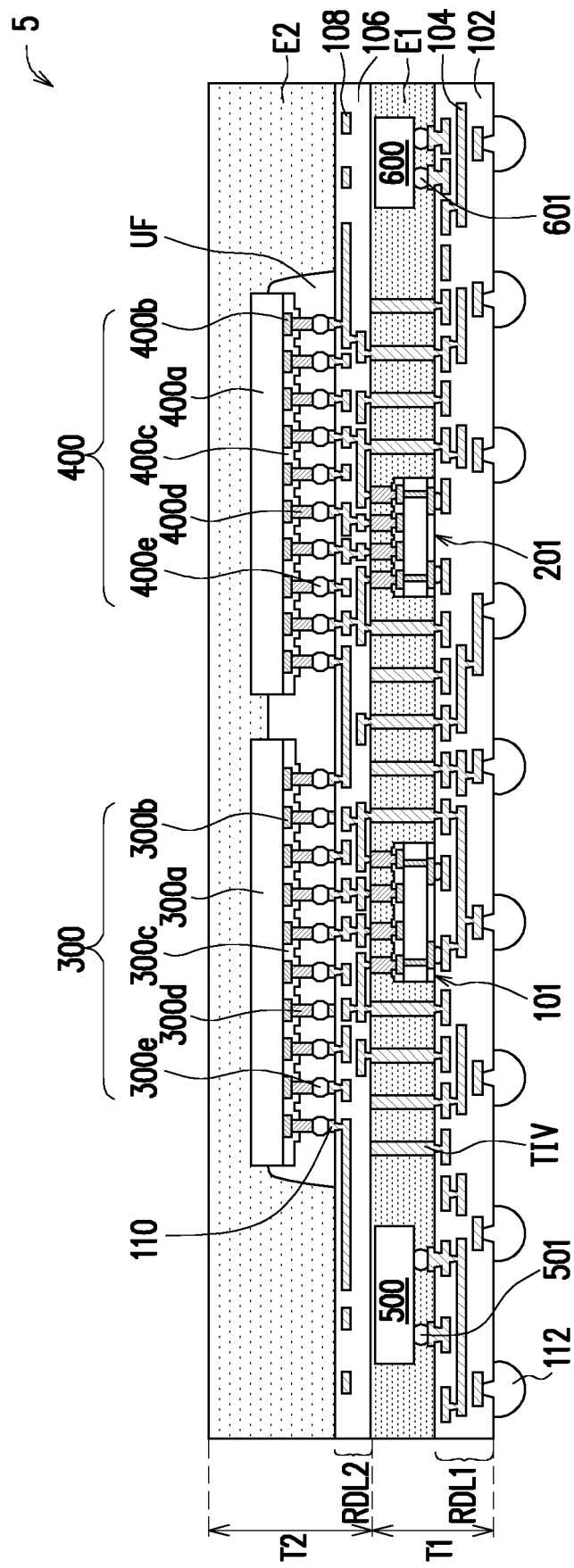

The multi-chip wafer level package 5 of FIG. 5 is similar to the multi-chip wafer level package 2 of FIG. 2, and the difference between them lies in that, each of the first and second semiconductor chips 100 and 200 in FIG. 2 is a single-sided semiconductor chip, while each of the first and second semiconductor chips 101 and 201 in FIG. 5 is a double-sided semiconductor chip.

Figure 6:
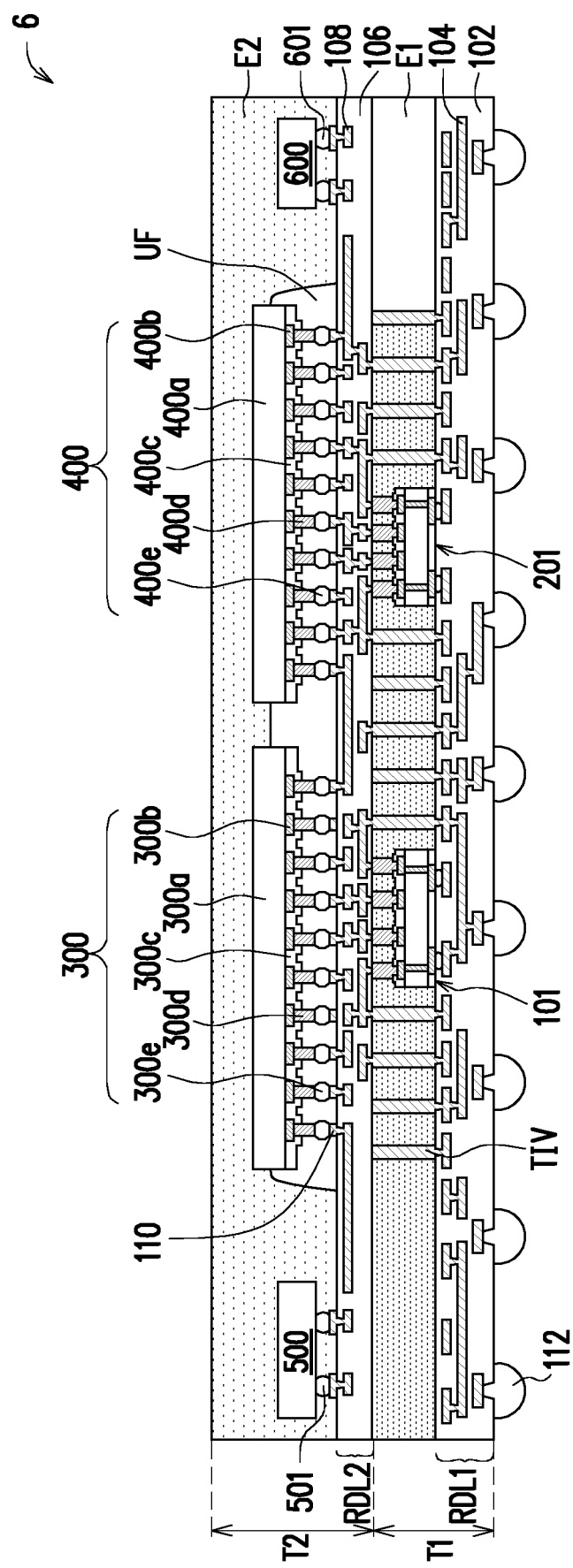

The multi-chip wafer level package 6 of FIG. 6 is similar to the multi-chip wafer level package 3 of FIG. 3, and the difference between them lies in that, each of the first and second semiconductor chips 100 and 200 in FIG. 3 is a single-sided semiconductor chip, while each of the first and second semiconductor chips 101 and 201 in FIG. 6 is a double-sided semiconductor chip.

The above embodiments in which each of the multi-chip wafer level packages is formed by using a single carrier are provided for illustration purposes, and are not construed as limiting the present disclosure. In alternative embodiments, multi-chip wafer level packages can be formed by using two carriers.

FIG. 7A to FIG. 7G are cross-sectional views of a method of forming a multi-chip wafer level package in accordance with alternative embodiments.

Figure 7A:
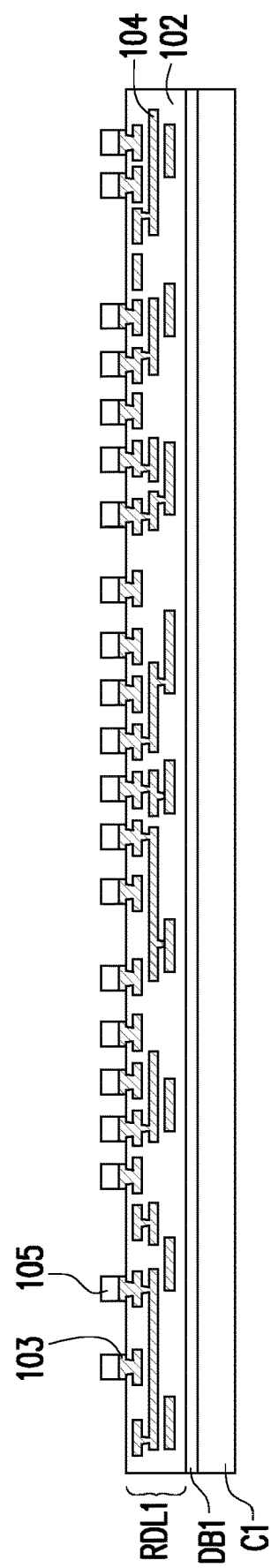
FIG. 7A to FIG. 7G are cross-sectional views of a method of forming a multi-chip wafer level package in accordance with alternative embodiments.

Referring to FIG. 7A, a first carrier C1 is provided with a first redistribution layer structure RDL1 formed thereon. In some embodiments, a first debonding layer DB1 is formed between the first carrier C1 and the first redistribution layer structure RDL1. In some embodiments, the first redistribution layer structure RDL1 includes a plurality of redistribution layers 104 embedded by a plurality of polymer layers 102. In some embodiments, the first redistribution layer structure RDL1 further includes a plurality of connecting pads 103 configured to connect to other semiconductor chips. In some embodiments, a plurality of bumps 105 are formed on the connecting pads 103 of the first redistribution layer structure RDL1. The bumps 105 may include solder bumps, and are formed with a ball drop process or an electroplating process.

Figure 7B:
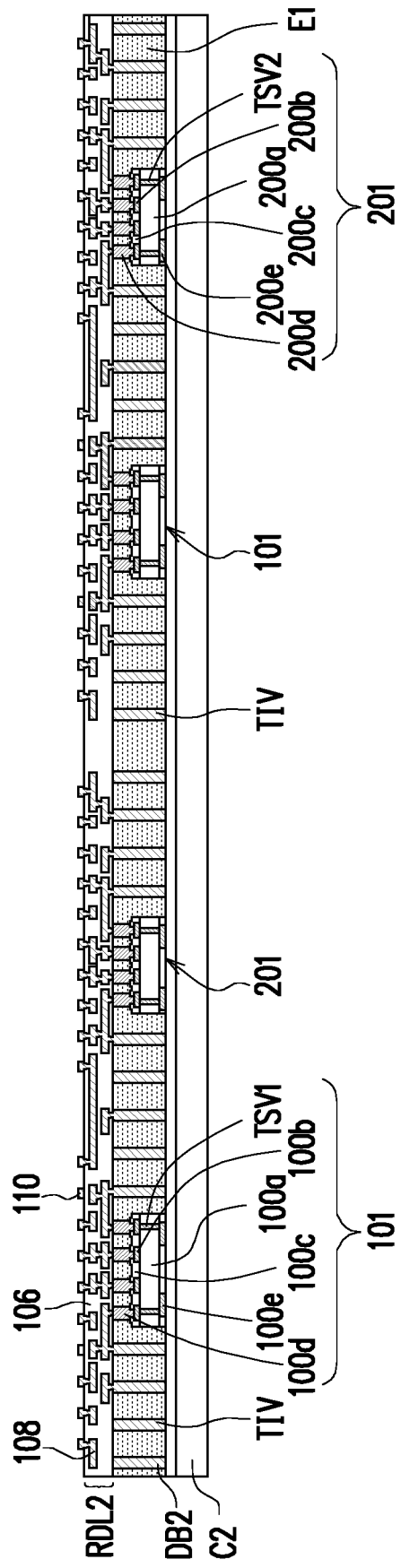

Thereafter, a chip module CM is provided. In some embodiments, the chip module CM can be formed by a method including steps in FIG. 7B to FIG. 7D. As shown in FIG. 7B, a second carrier C2 is provided with a second debonding layer DB2 formed thereon. Thereafter, a plurality of through integrated fan-out vias TIV are formed on the second debonding layer DB2. Afterwards, first and second semiconductor chips 101 and 201 are placed on the second carrier C2. In some embodiments, the second debonding layer DB2 is formed between the second carrier C2 and the backside of each of the first and second semiconductor chips 101 and 201. In some embodiments, the first semiconductor chips 101 and the second semiconductor chips 201 are arranged alternately on the second debonding layer DB2. Next, the first and second semiconductor chips 101 and 201 are encapsulated with a first encapsulation layer E1. A second redistribution layer structure RDL2 is then formed on the first encapsulation layer E1.

In some embodiments, the critical dimension of the second redistribution layer structure RDL2 can be less than the critical dimension of the first redistribution layer structure RDL1. In alternative embodiments, the critical dimension of the second redistribution layer structure RDL2 can be substantially the same as or greater than the critical dimension of the first redistribution layer structure RDL1 as needed.

Figure 7C:
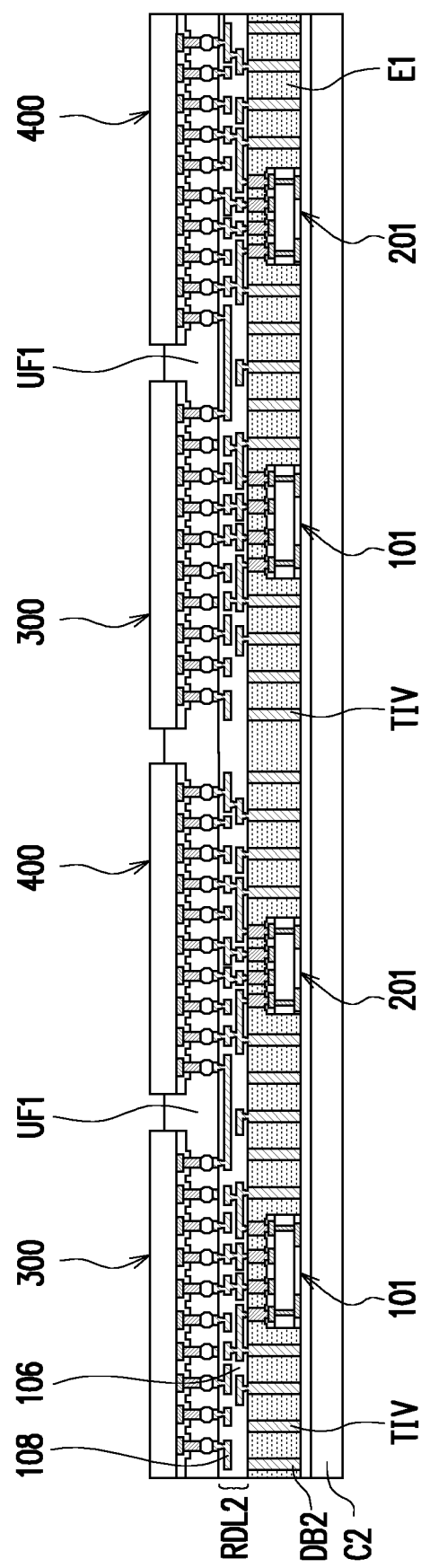

As shown in FIG. 7C, third and fourth semiconductor chips 300 and 400 are placed on and bonded to the second redistribution layer structure RDL2. In some embodiments, the third semiconductor chips 300 and the fourth semiconductor chips 400 are arranged alternately on the second redistribution layer structure RDL2. In some embodiments, the third semiconductor chips 300 respectively correspond to the first semiconductor chips 101, and the fourth semiconductor chips 400 respectively correspond to the second semiconductor chips 201.

Thereafter, and underfill layer UF1 is formed to fill the space between the second redistribution layer structure RDL2 and each of the third and fourth semiconductor chips 300 and 400.

Figure 7D:
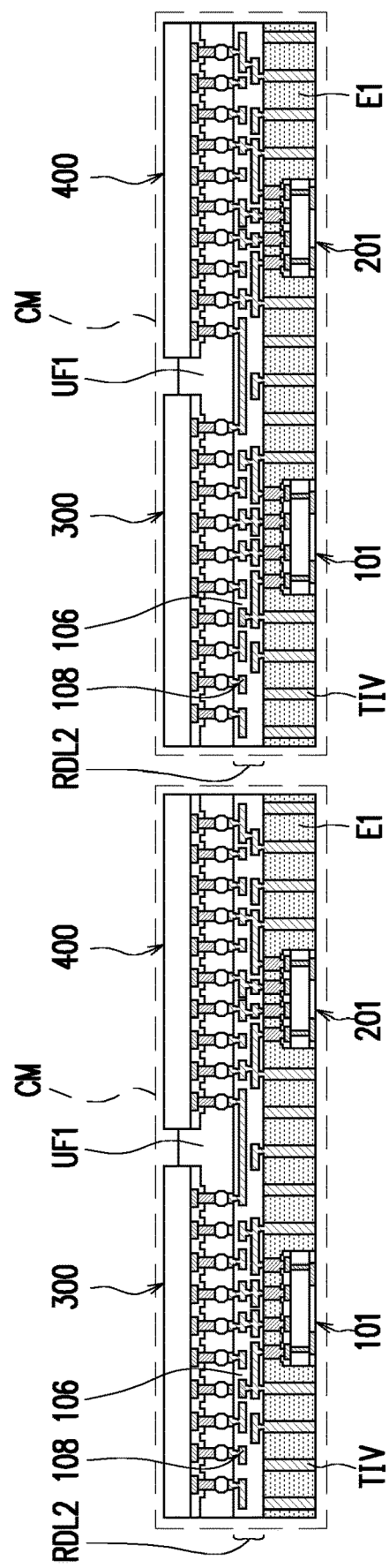

As shown in FIG. 7D, the second carrier C2 is debonded from the backsides of the first and second semiconductor chips 101 and 201. In some embodiments, bumps may be formed at the backsides of the first and second semiconductor chips 101 and 201 and bonded to the backside pads. A singulation process is then performed to separate chip modules CM from each other. In at least one embodiment, the edges of third and fourth semiconductor chips 300 and 400 are substantially aligned with the edge of the second redistribution layer structure RDL2.

In some embodiments, each of the chip modules CM includes a second redistribution layer structure RDL2, first and second semiconductor chips 101 and 201 at one side of the second redistribution layer structure RDL2, a first encapsulation layer E1 encapsulating the first and second semiconductor chips 101 and 201, and third and fourth semiconductor chips 300 and 400 at the opposite side of the second redistribution layer structure RDL2. In some embodiments, each of the chip modules CM includes a first encapsulation layer E1 that encapsulates the sidewalls of the first and second semiconductor chips 101 and 201. In some embodiments, each of the chip modules CM includes through integrated fan-out vias TIV and an underfill layer UF1. In some embodiments, the through integrated fan-out vias TIV penetrates through the first encapsulation layer E1 and aside and/or between the first and second semiconductor chips 101 and 201, and the underfill layer UF1 is formed to fill the space between the second redistribution layer structure RDL2 and each of the third and fourth semiconductor chips 300 and 400.

Figure 7E:
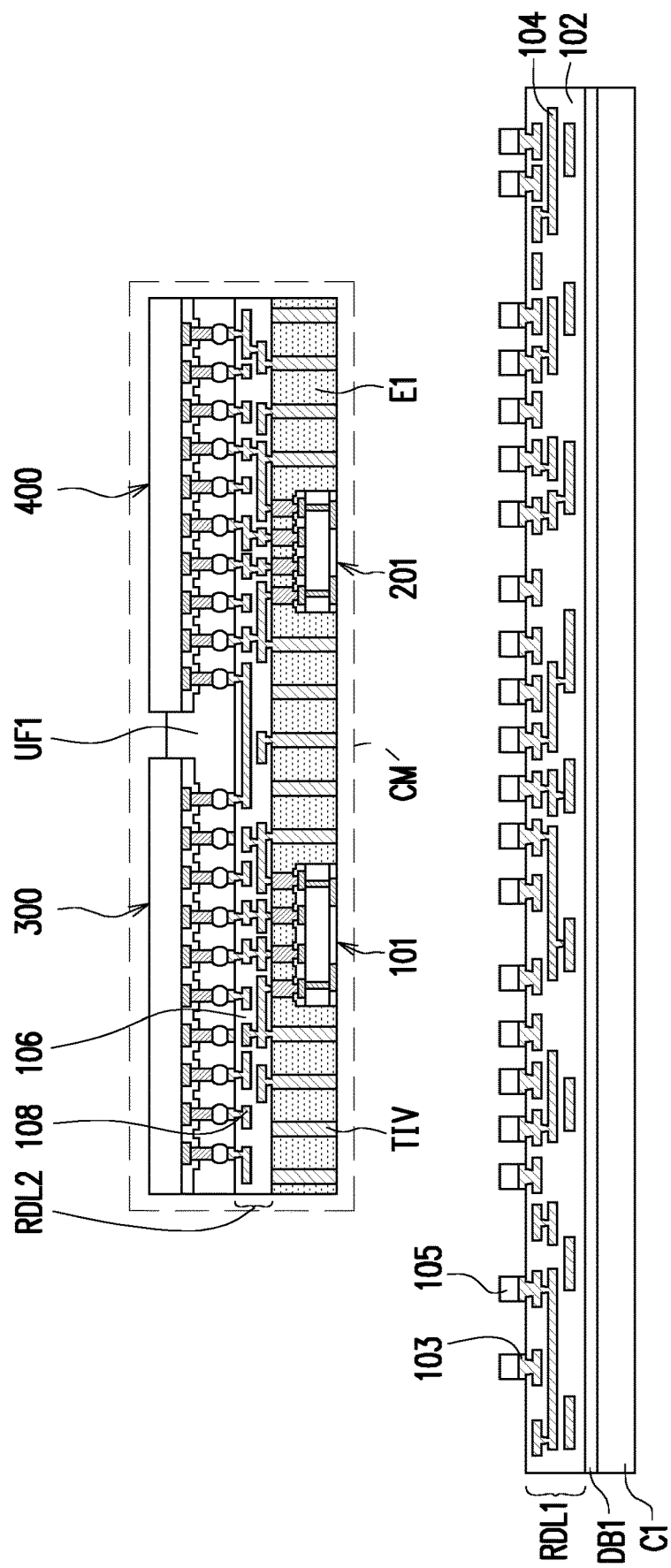
Figure 7F:
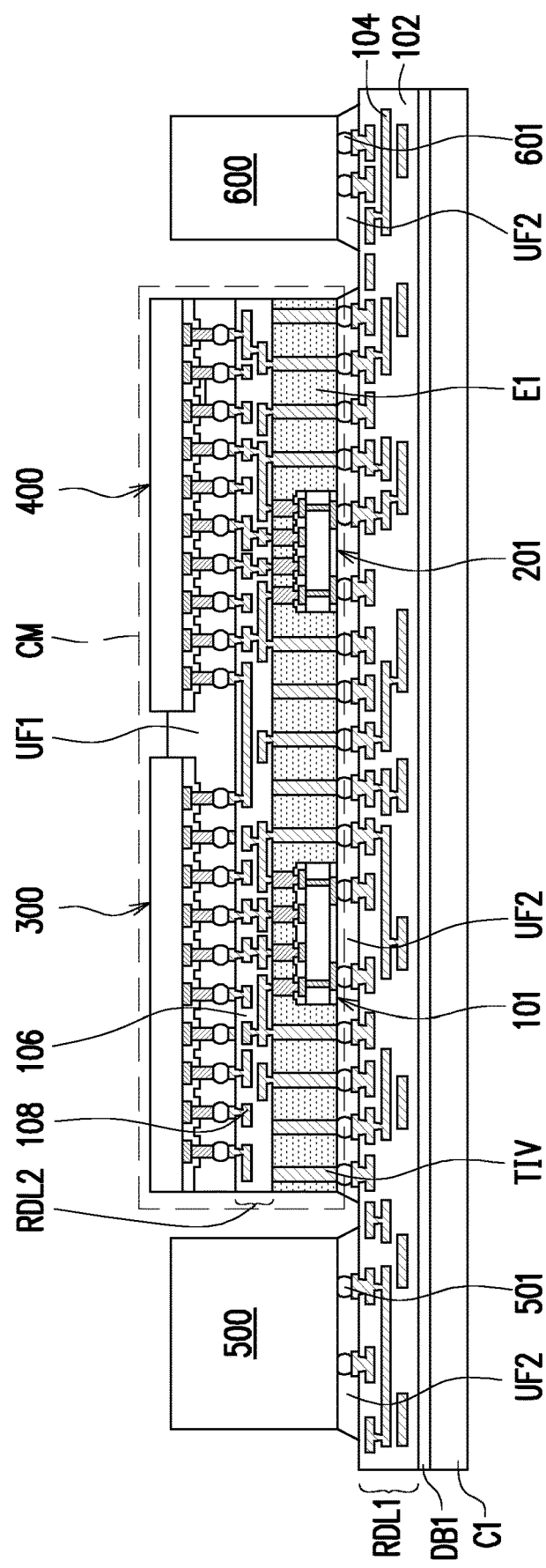

Referring to FIG. 7E and FIG. 7F, one chip module CM is placed on and bonded to a first side of the first redistribution layer structure RDL1. In some embodiments, the chip module CM is bonded to the first redistribution layer structure RDL1 with the backsides of the first and second semiconductor chips 101 and 201 being in physical contact with the first redistribution layer structure RDL1. In some embodiments, the backside pads of the first and second semiconductor chips 101 and 201 and the through integrated fan-out vias TIV of the chip module CM are electrically connected to the first redistribution layer structure RDL1 through the corresponding bumps 105.

In some embodiments, when the chip module CM is placed on and bonded to the first redistribution layer structure RDL1, fifth and sixth semiconductor chips 500 and 600 are placed on and bonded to the first redistribution layer structure RDL1 through the bumps 501 and 601 thereof.

Thereafter, and underfill layer UF2 is formed to fill the space between the first redistribution layer structure RDL1 and each of the chip module CM, the fifth semiconductor chip 500 and the sixth semiconductor chip 600.

Figure 7G:
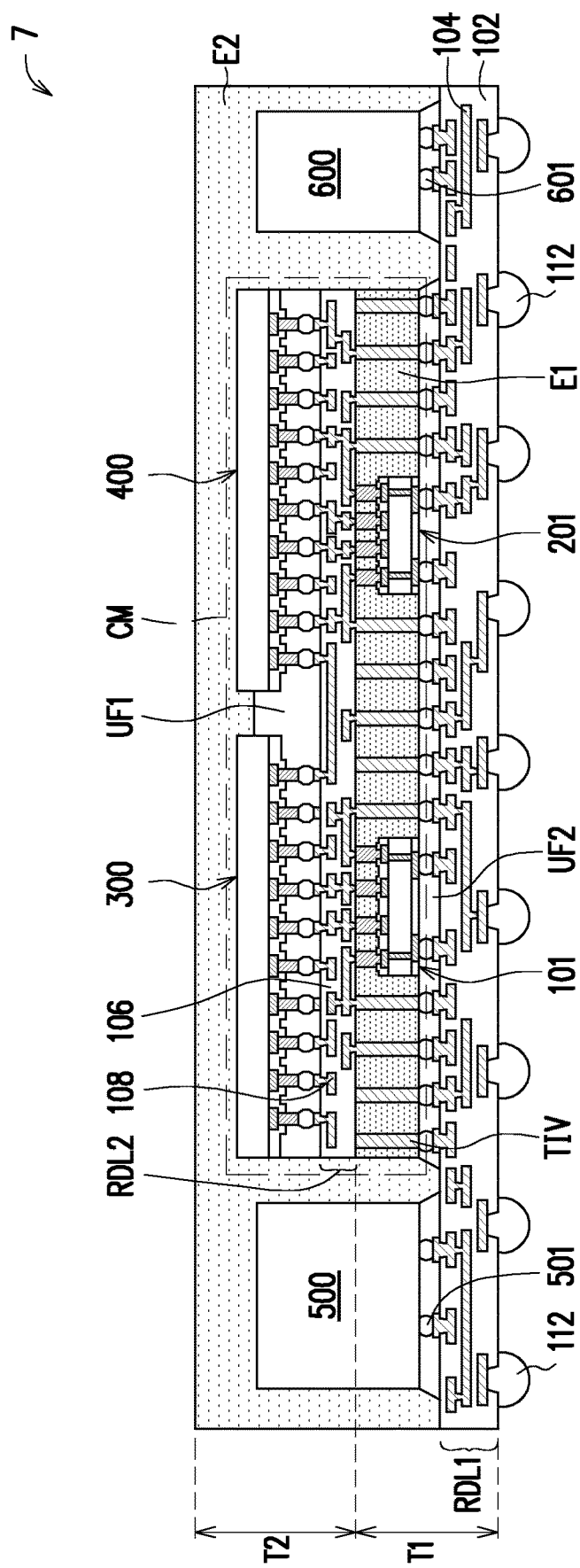

Referring to FIG. 7G, the chip module CM and the fifth and sixth semiconductor chips 500 and 600 are encapsulated with a second encapsulation layer E2. In some embodiments, the second encapsulation layer E2 is formed over the first redistribution layer structure RDL1 to encapsulate or surround the sidewalls and tops of the chip module CM and the fifth and sixth semiconductor chips 500 and 600. The first and second encapsulation layers E1 and E2 can include the same or different materials.

Thereafter, bumps 112 are placed on a second side of the first redistribution layer structure RDL1 opposite to the first side and bonded to the connecting pads of the first redistribution layer structure RDL1. A multi-chip wafer level package 7 is thus completed. In some embodiments, the multi-chip wafer level package 7 is constituted by a first tier T1 and a second tier T2 in physical contact with each other. In some embodiments, the first tier T1 includes the first redistribution layer structure RDL1 and the first and second semiconductor chips 101 and 201 thereon, and the second tier T2 includes the second redistribution layer structure RDL2 and the third and fourth semiconductor chips 300 and 400 thereon.

Figure 8:
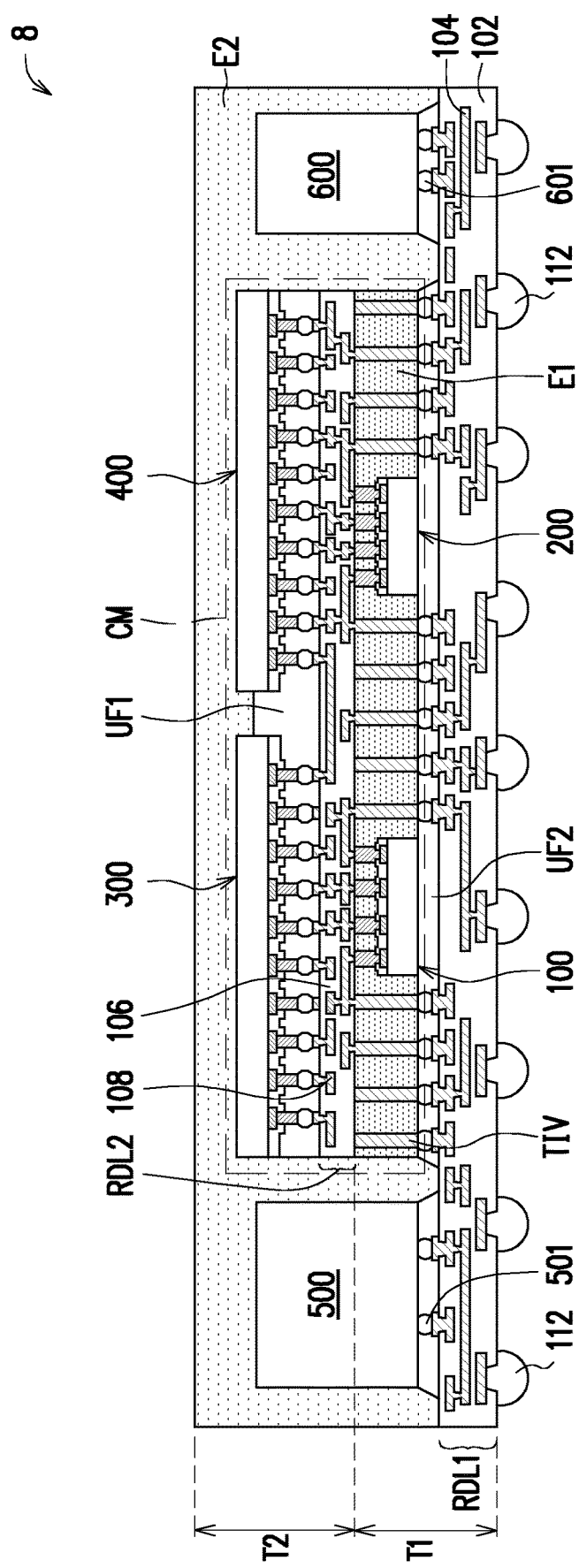
FIG. 8 to FIG. 10 are cross-sectional views of multi-chip wafer level packages in accordance with alternative embodiments.
Figure 9:
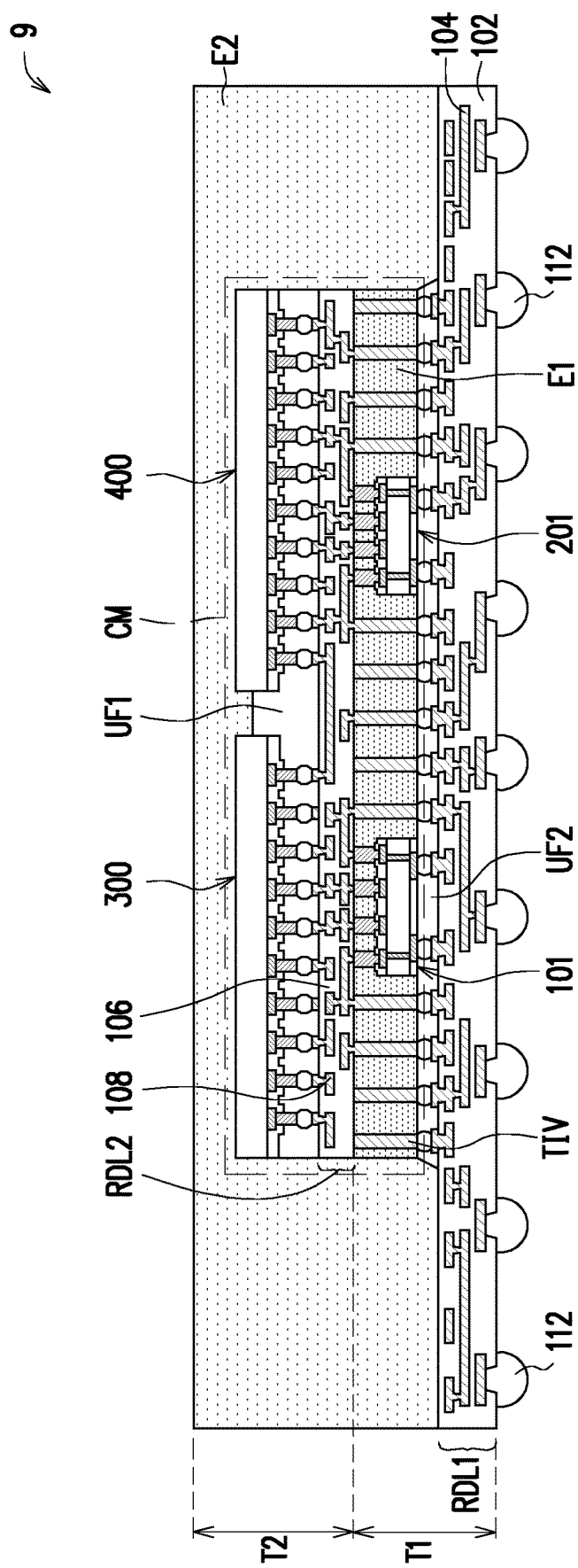
Figure 10:
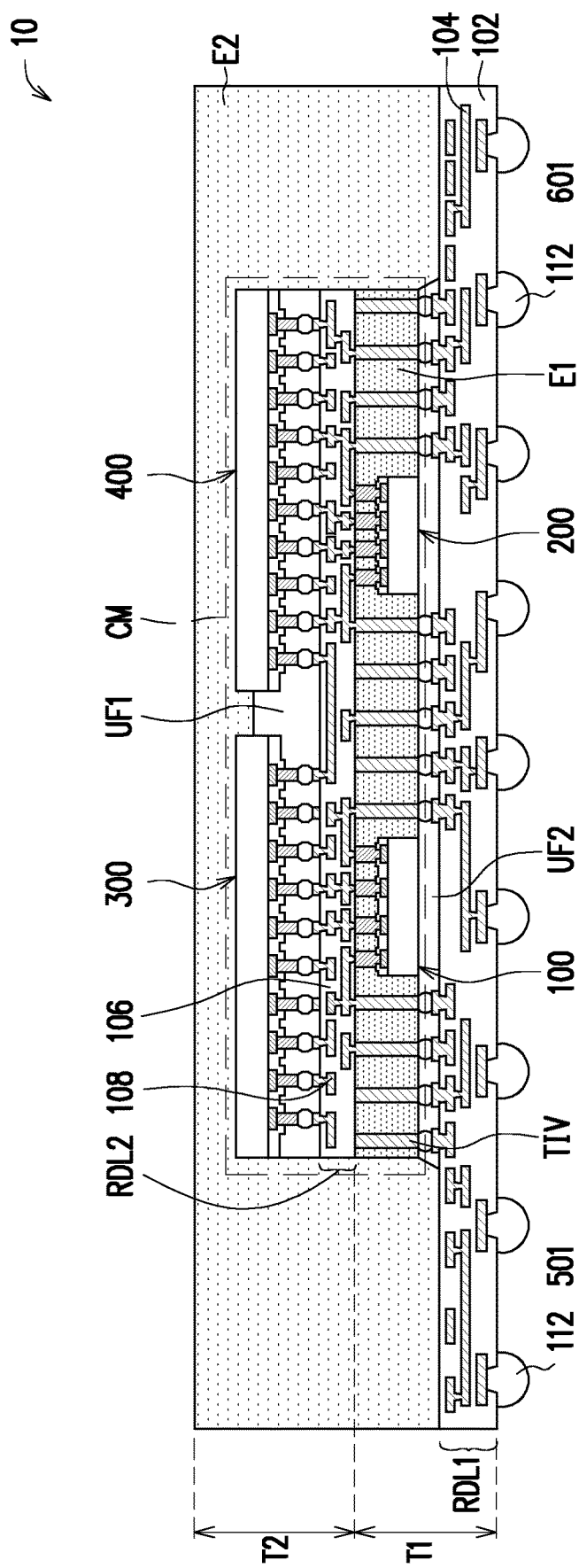

Possible modifications and alterations can be made to the multi-chip wafer level packages. These modifications and alterations are provided for illustration purposes, and are not construed as limiting the present disclosure. FIG. 8 to FIG. 10 are cross-sectional views of multi-chip wafer level packages in accordance with alternative embodiments.

The multi-chip wafer level package 8 of FIG. 8 is similar to the multi-chip wafer level package 7 of FIG. 7G, and the difference between them lies in that, each of the first and second semiconductor chips 101 and 201 in FIG. 7G is a double-sided semiconductor chip, while each of the first and second semiconductor chips 100 and 200 in FIG. 8 is a single-sided semiconductor chip.

The multi-chip wafer level package 9 of FIG. 9 is similar to the multi-chip wafer level package 7 of FIG. 7G, and the difference between them lies in that, the multi-chip wafer level package 9 of FIG. 9 is provided without fifth and sixth semiconductor devices 500 and 600.

The multi-chip wafer level package 10 of FIG. 10 is similar to the multi-chip wafer level package 8 of FIG. 8, and the difference between them lies in that, the multi-chip wafer level package 10 of FIG. 10 is provided without fifth and sixth semiconductor devices 500 and 600.

The above embodiments in which each of the multi-chip wafer level packages has two tiers and each tier has two chips and one redistribution layer structure are provided for illustration purposes, and are not construed as limiting the present disclosure. In some embodiments, more than one redistribution layer structures can be included in at least one of the two tiers. In some embodiments, at least one of the two tiers can be designed to have a single chip or more than two chips as needed.

FIG. 11 to FIG. 14 are cross-sectional views of multi-chip wafer level packages in accordance with yet alternative embodiments.

Figure 11:
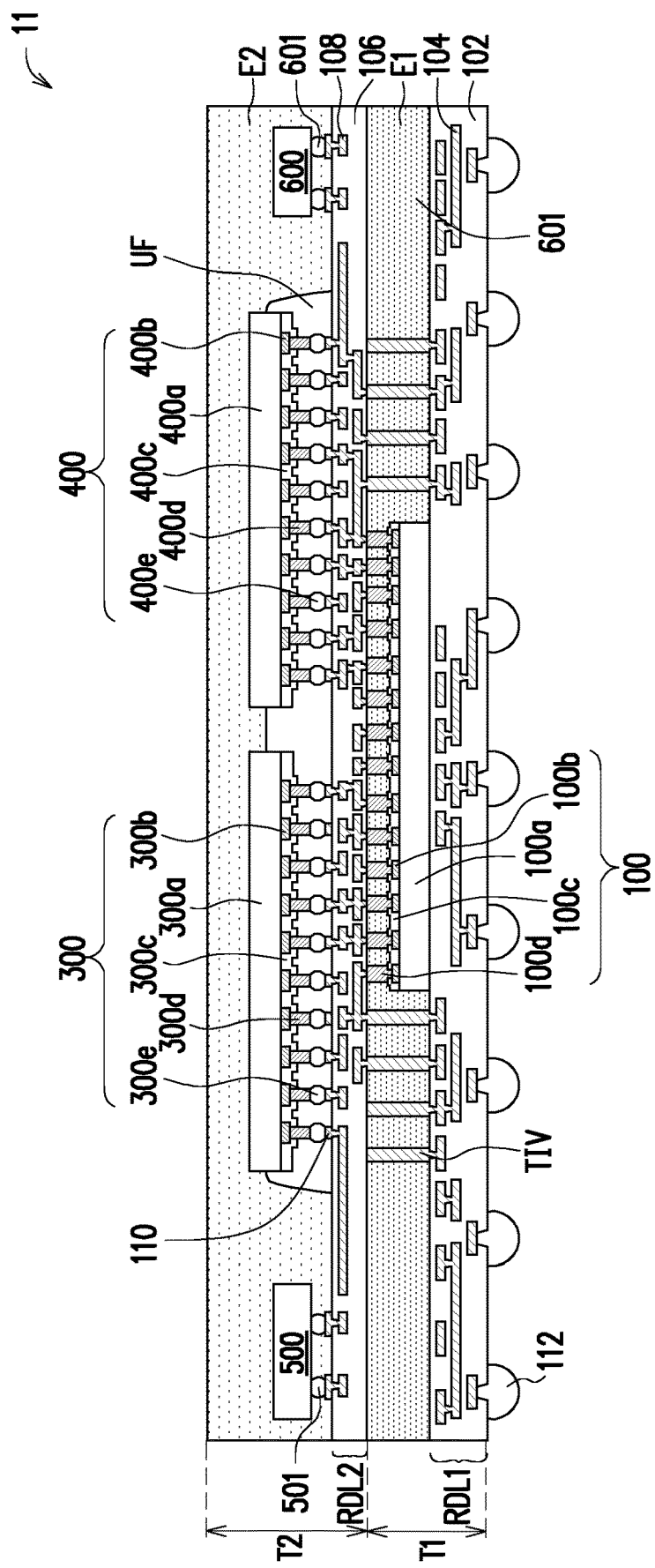
FIG. 11 to FIG. 14 are cross-sectional views of multi-chip wafer level packages in accordance with yet alternative embodiments.

The multi-chip wafer level package 11 of FIG. 11 is similar to the multi-chip wafer level package 3 of FIG. 3, and the difference between them lies in that, the first tier T1 of the multi-chip wafer level package 11 of FIG. 11 has one semiconductor chip, while the first tier T1 of the multi-chip wafer level package 3 of FIG. 3 has two semiconductor chips. Specifically, as shown in FIG. 11, a single semiconductor chip (e.g., first semiconductor chip 100) is disposed in the first tier T1 and electrically connected to the third and fourth semiconductor chips 300 and 400 through the second redistribution layer structure RDL2.

Figure 12:
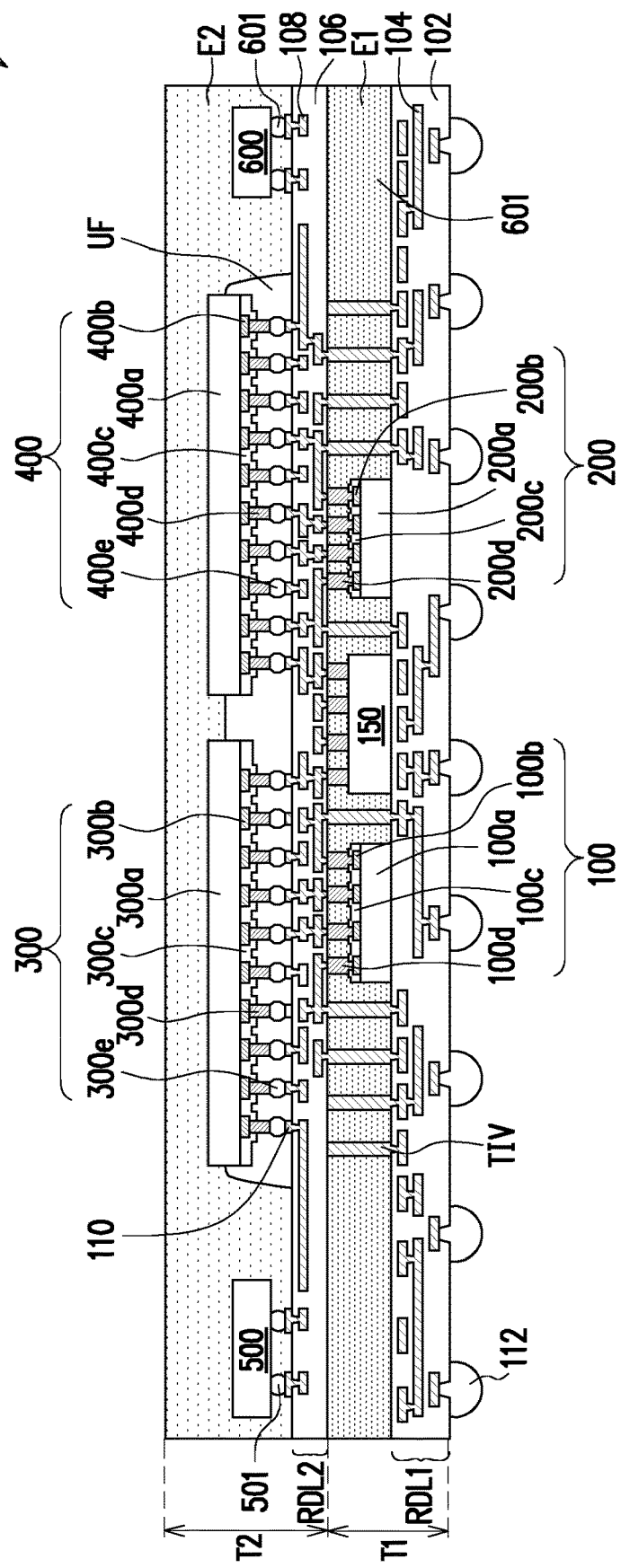

The multi-chip wafer level package 12 of FIG. 12 is similar to the multi-chip wafer level package 3 of FIG. 3, and the difference between them lies in that, the first tier T1 of the multi-chip wafer level package 12 of FIG. 12 has three semiconductor chips, while the first tier T1 of the multi-chip wafer level package 3 of FIG. 3 has two semiconductor chips. Specifically, as shown in FIG. 12, first and second semiconductor chips 100 and 200 and an interposer 150 between the first and second semiconductor chips 100 and 200 are disposed in the first tier T1. In some embodiments, the interposer 150 has a through silicon interposer (TSI) structure used to provide electrical connections for the stacked chips. In some embodiments, the interposer 150 includes at least some of through silicon vias, passive devices, fuses, redistribution layers and bumps. In some embodiments, the third semiconductor chip 300 is electrically connected to the fourth semiconductor chip 400 through the interposer 150 between the first and second semiconductor chips 100 and 200.

Figure 13:
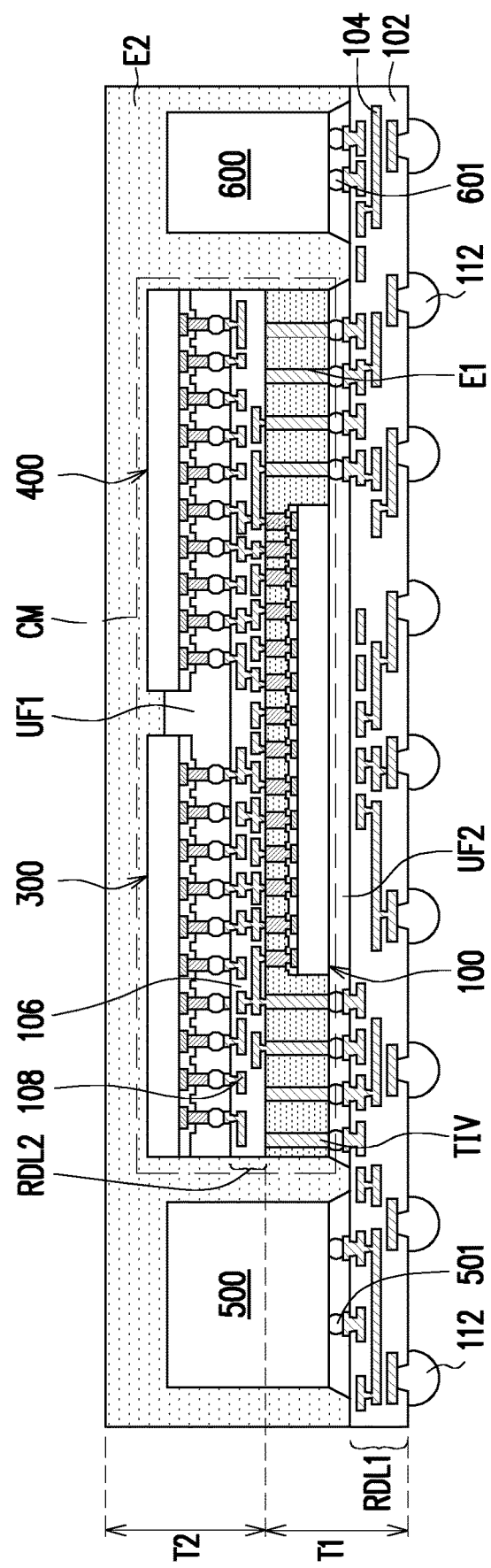

The multi-chip wafer level package 13 of FIG. 13 is similar to the multi-chip wafer level package 8 of FIG. 8, and the difference between them lies in that, the first tier T1 of the multi-chip wafer level package 13 of FIG. 13 has one semiconductor chip, while the first tier T1 of the multi-chip wafer level package 8 of FIG. 8 has two semiconductor chips. Specifically, as shown in FIG. 13, a single semiconductor chip (e.g., first semiconductor chip 100) is disposed in the first tier T1 and electrically connected to the third and fourth semiconductor chips 300 and 400 through the second redistribution layer structure RDL2.

Figure 14:
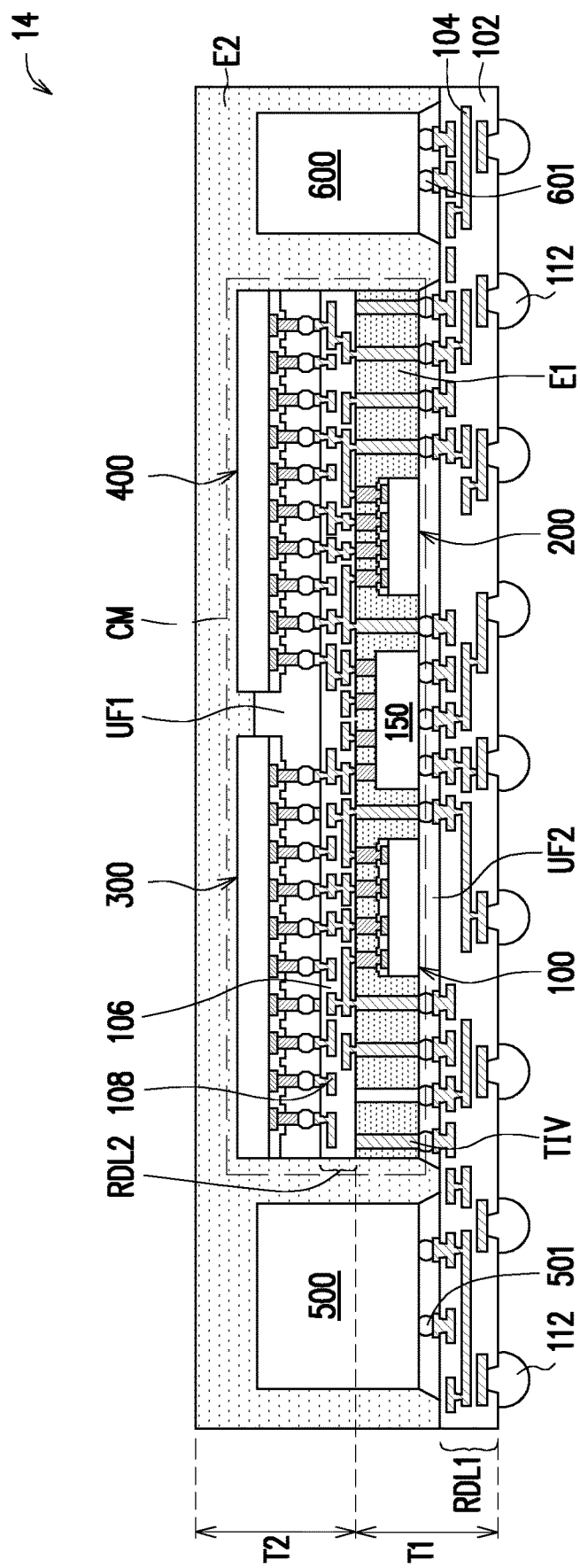

The multi-chip wafer level package 14 of FIG. 14 is similar to the multi-chip wafer level package 8 of FIG. 8, and the difference between them lies in that, the first tier T1 of the multi-chip wafer level package 14 of FIG. 14 has three semiconductor chips, while the first tier T1 of the multi-chip wafer level package 3 of FIG. 3 has two semiconductor chips. Specifically, as shown in FIG. 14, first and second semiconductor chips 100 and 200 and an interposer 150 between the first and second semiconductor chips 100 and 200 are disposed in the first tier T1. In some embodiments, the third semiconductor chip 300 is electrically connected to the fourth semiconductor chip 400 through the interposer 150 between the first and second semiconductor chips 100 and 200.

It is appreciated by people having ordinary skill in the art that the concept of the single chip or the interposer described above can be applied to the multi-chip wafer level packages in FIG. 1G, FIG. 2, FIGS. 4-6, FIG. 7G and FIGS. 9-14 other than FIG. 3 and FIG. 8.

The structures of the multi-chip wafer level packages are illustrated below with reference to FIG. 1G, FIGS. 2-6, FIG. 7G and FIGS. 8-14. In some embodiments, a multi-chip wafer level package 1/2/3/4/5/6/7/8/9/10/11/12/13/14 includes a first tier T1 and a second tier T2 stacked thereon.

In some embodiments, the first tier T1 includes a first redistribution layer structure RDL1 and at least one chip over the first redistribution layer structure RDL1. In some embodiments, the at least one chip can be a single chip (e.g., first semiconductor chip 100), as shown in FIG. 11 and FIG. 13. In alternative embodiments, the at least one chip includes two chips (e.g., first and second semiconductor chips 100 and 200 or 101 and 201), as shown in FIG. 1G, FIGS. 2-6, FIG. 7G and FIGS. 8-10. In yet alternative embodiments, the at least one chip includes three chips (e.g., first and second semiconductor chips 100 and 200 and an interposer 150), as shown in FIG. 12 and FIG. 14. More than three chips can be applied in the first tier T1 as needed. In some embodiments, the first redistribution layer structure RDL1 extends laterally beyond the at least one chip, as shown in FIG. 1G, FIGS. 2-6, FIG. 7G and FIGS. 8-14. In some embodiments, the at least one chip is encapsulated by a first encapsulation layer E1. In some embodiments, a second encapsulation layer E2 is provided to encapsulate the first encapsulation layer E1, as shown in FIG. 7G and FIGS. 8-10 and FIGS. 13-14.

In some embodiments, the second tier T2 includes a second redistribution layer structure RDL2 and at least two other chips over the second redistribution layer structure RDL2. In some embodiments, the at least two other chips include third and fourth semiconductor chips 300 and 400, as shown in FIG. 1G, FIGS. 2-6, FIG. 7G and FIGS. 8-14. A single chip or more than two chips can be applied in the second tier T2 as needed. In some embodiments, the second redistribution layer structure RDL2 extends laterally beyond the first redistribution layer RDL1 or laterally beyond the at least two other chips, as shown in FIG. 1G, FIGS. 2-6 and FIGS. 11-12. In alternative embodiments, the edge of the second redistribution layer structure RDL2 is substantially aligned to the edge of the first redistribution layer structure RDL1 or the edge of the at least two other chips, as shown in FIG. 7G, FIGS. 8-10 and FIGS. 13-14. In some embodiments, the at least two other chips are encapsulated by the second encapsulation layer E2.

In some embodiments, the first tier T1 is bonded to the second tier T2 with the at least one chip in the first tier T1 being in physical contact with the second redistribution layer structure RDL2 in the second tier T2. In some embodiments, the connectors of the at least one chip in the first tier T1 and the connectors of the at least two other chips in the second tier T2 are in physical contact with the second redistribution layer structure RDL2.

In some embodiments, the total number of connectors of the at least two other chips in the second tier T2 is greater than (e.g., at least two times, at least five times or at least eight times) the total number of connectors of the at least one chip in the first tier T1. However, the present disclosure is not limited thereto. In alternative embodiments, the total number of connectors of the at least two other chips in the second tier T2 can be substantially equal to or greater than the total number of connectors of the at least one chip in the first tier T1.

In some embodiments, the at least one chip in the first tier T1 includes an integrated passive device chip, and each of the at least two other chips in the second tier T2 includes an active integrated device chip. However, the present disclosure is not limited thereto. In alternative embodiments, at least one chip in the first tier T1 includes an integrated active device chip. In yet alternative embodiments, at least one chip in the second tier T2 includes an integrated passive device chip.

In some embodiments, the multi-chip wafer level package 2/3/5/6/7/8/11/12/13/14 further includes another chip over the first redistribution layer structure RDL1 or the second redistribution layer structure RDL2 and at an outer side of the at least one chip. In some embodiments, the another chip includes fifth and sixth semiconductor chips 500 and 600, as shown in FIGS. 2-3, FIGS. 5-6, FIG. 7G, FIG. 8 and FIGS. 11-14. In some embodiments, the another chip is encapsulated by the first encapsulation layer E1, as shown in FIG. 2 and FIG. 5. In alternative embodiments, the another chip is encapsulated by the second encapsulation layer E2, as shown in FIG. 3, FIG. 6, FIG. 7G, FIG. 8 and FIGS. 11-14. In some embodiments, the another chip includes an integrated passive device chip. In alternative embodiments, the another chip includes an integrated active device chip.

In some embodiments, the multi-chip wafer level package 1/2/3/4/5/6/7/8/9/10 includes a first redistribution layer structure RDL1, a first semiconductor chip 100/101, a second semiconductor chip 200/201, a second redistribution layer structure RDL2, a third semiconductor chip 300, a fourth semiconductor chip 400 and a plurality of bumps 112. The first semiconductor chip 100/101 is over a first side of first redistribution layer structure RDL1. The second semiconductor chip 200/201 is aside the first semiconductor chip 100/101 and over the first side of the first redistribution layer structure RDL1. The second redistribution layer structure RDL2 is over the first semiconductor chip 100/101 and the second semiconductor chip 200/201. The third semiconductor chip 300 is over the second redistribution layer structure RDL2 and electrically connected to the first semiconductor chip 100/101. The fourth semiconductor chip 400 is over the second redistribution layer structure RDL2 and electrically connected to the second semiconductor chip 200/201 and the third semiconductor chip 300. The bumps 112 are over a second side of the first redistribution layer structure RDL1 opposite to the first side.

In some embodiments, at least one of the first semiconductor chip 100/101 and the second semiconductor chip 200/201 includes an integrated passive device chip. In some embodiments, at least one of the first and second semiconductor chips is a single-sided semiconductor chip with connectors at a single side and bonded to the second redistribution layer structure RDL2. In alternative embodiments, at least one of the first and second semiconductor chips is a double-sided semiconductor chip with connectors at opposite sides and respectively bonded to the first and second redistribution layer structures RDL1 and RDL2. In some embodiments, at least one of the third and fourth semiconductor chips 300 and 400 includes an active integrated device chip.

In some embodiments, the third semiconductor chip 300 is electrically connected to the fourth semiconductor chip 400 through the second redistribution layer structure RDL2. In alternative embodiments, the third semiconductor chip 300 is electrically connected to the fourth semiconductor chip 400 through the second redistribution layer structure RDL2 and an interposer 150 between the first and second semiconductor chips 100 and 200.

In some embodiments, fifth and sixth semiconductor chips 500 and 600 are further included in some of the multi-chip wafer level packages. In some embodiments, the fifth and sixth semiconductor chips 500 and 600 are over the first side of the first redistribution layer structure RDL1 and at outer sides of the first and second semiconductor chips 100 and 200. In alternative embodiments, the fifth and sixth semiconductor chips 500 and 600 are over the second redistribution layer structure RDL2 and at outer sides of the third and fourth semiconductor chips 300 and 400.

The elements or features of each of the above semiconductor chips are provided for illustration purposes, and are not construed as limiting the present disclosure. It is appreciated by people having ordinary skill in the art that other elements or features can be further included in the semiconductor chips as needed.

FIG. 17 to FIG. 20 are cross-sectional views of semiconductor chips in accordance with alternative embodiments.

Figure 17:
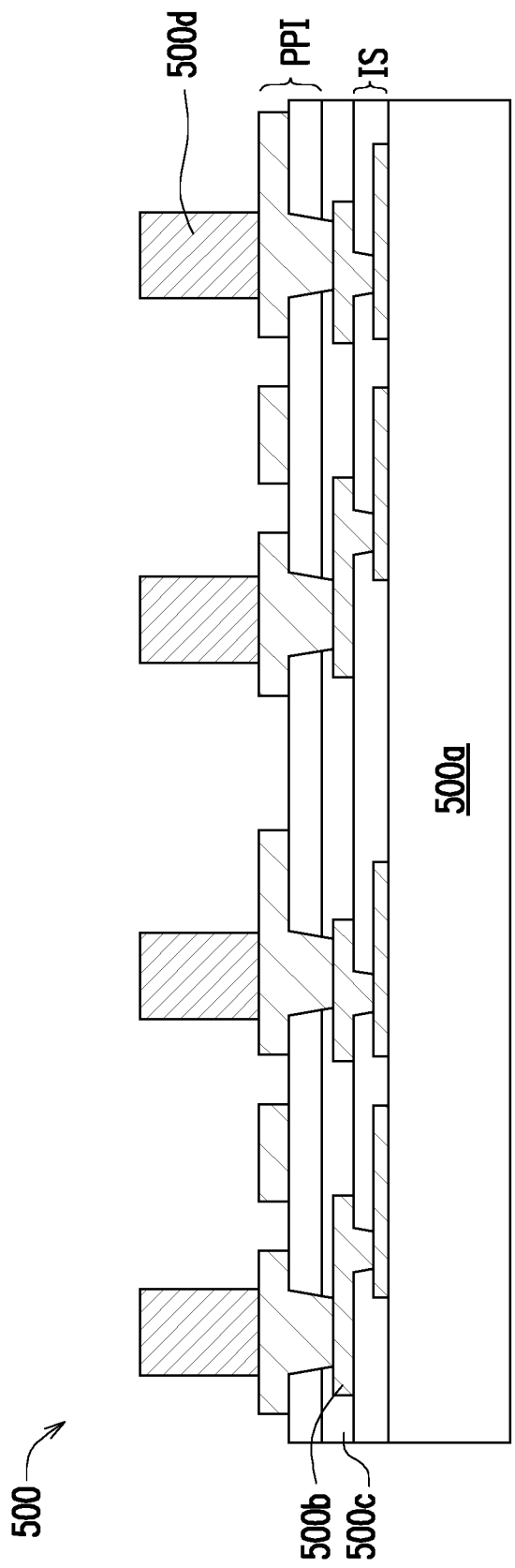
FIG. 17 to FIG. 20 are cross-sectional views of semiconductor chips in accordance with alternative embodiments.

Referring to FIG. 17, a semiconductor chip 500 includes a substrate 500a, an interconnection structure IS, one or more pads 500b, a passivation layer 500c, a post-passivation interconnection structure PPI, and one or more connectors 500d. The substrate 500a includes, for example but not limited to, bulk silicon, doped or undoped, or an active layer of a semiconductor-on-insulator (SOI) substrate. The interconnection structure IS can be formed on the substrate 500a. The interconnection structure IS includes at least one metal layer embedded by at least one dielectric layer. The pads 500b are formed over the interconnection structure IS, and the passivation layer 500c is formed over the pads 500b. In some embodiments, the pads 500b are aluminum pads, and the passivation layer 500c includes a polymer material such as polybenzoxazole (PBO), polyimide, benzocyclobutene (BCB), a combination thereof, or the like. The connectors 500d are formed through the passivation layer 500c and electrically connected to underlying pads 500b or the interconnection structure IS. In some embodiments, the connectors 500d may include Cu, W, Ni, Sn, Ti, Au, an alloy or a combination thereof, and are formed with a ball drop process or an electroplating process.

Figure 18:
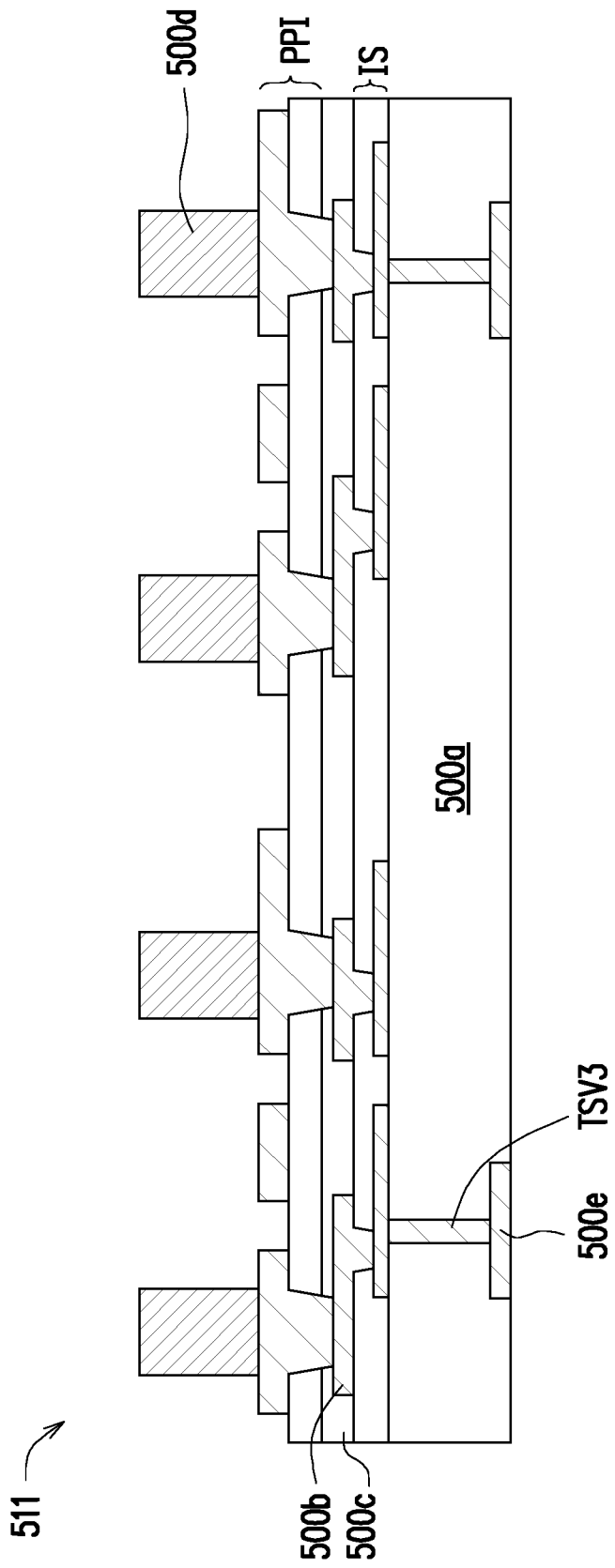

The semiconductor chip 511 of FIG. 18 is similar to the semiconductor chip 500 of FIG. 17, and the difference between them lies in that, the semiconductor chip 511 of FIG. 18 further includes one or more pads 500e in a backside portion thereof and one or more through silicon vias TSV3 between and electrically connected to the pads 500e and the interconnection structure IS. In some embodiments, bumps may be formed on the backside of the semiconductor chip 511 and bonded to the pads 500e. In some embodiments, the connectors 500d constitute the front-side connectors of the semiconductor chip 511, and the pads 500e and/or optional bumps constitute the backside connectors of the semiconductor chip 511.

Figure 19:
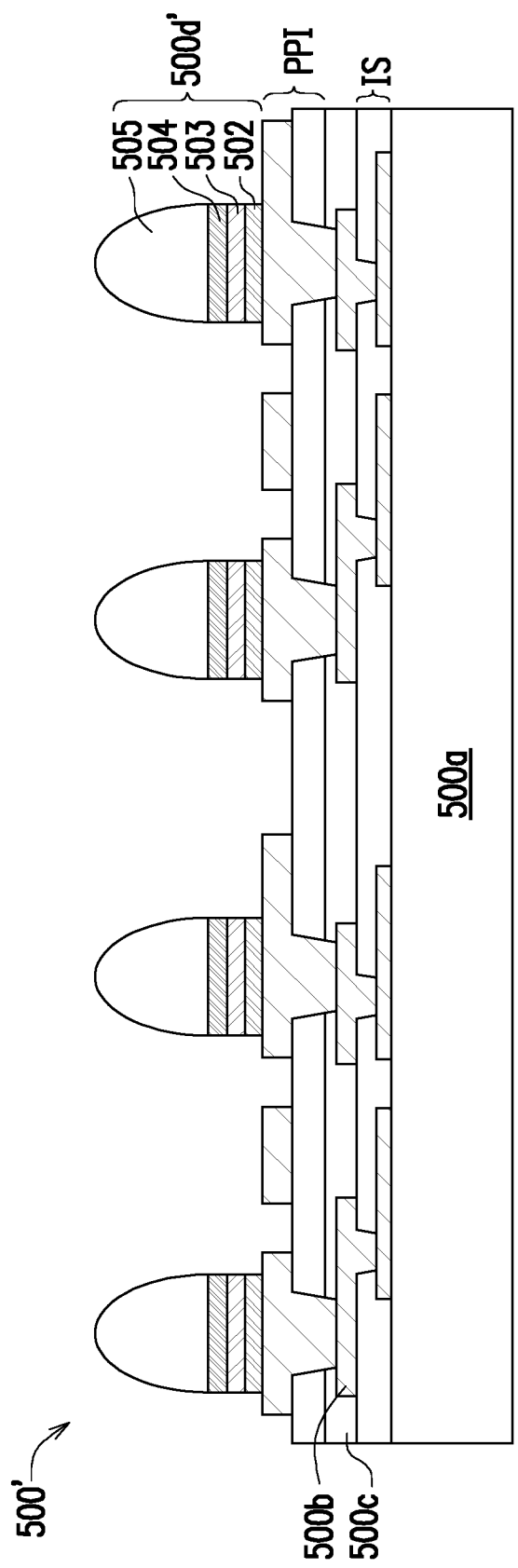

The semiconductor chip 500' of FIG. 19 is similar to the semiconductor chip 500 of FIG. 17, and the difference between them lies in the connector structure. In some embodiments, as shown in FIG. 19, each of the connectors 500d' includes, from bottom to top, a copper layer 502, a nickel layer 503, another copper layer 504 and a solder bump 505. Other types of connection structures can be used upon the process requirements.

Figure 20:
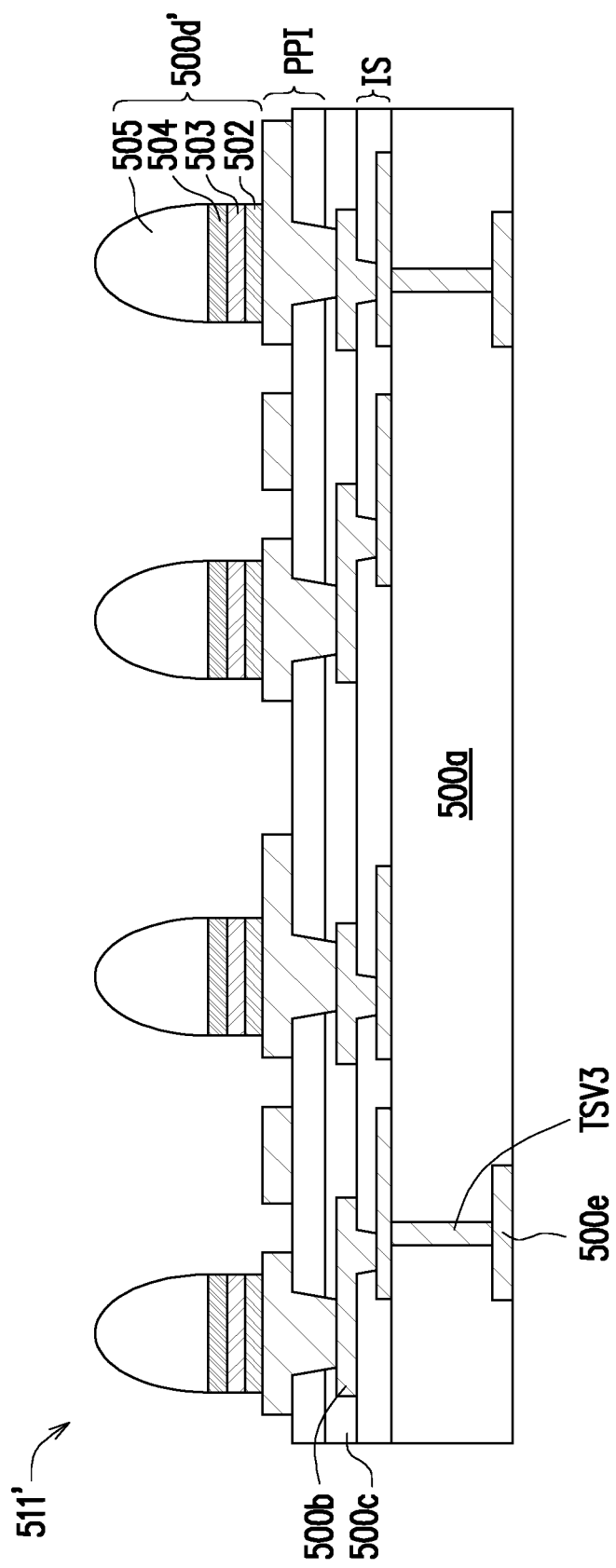

The semiconductor chip 511' of FIG. 20 is similar to the semiconductor chip 511 of FIG. 18, and the difference between them lies in the connector structure. In some embodiments, as shown in FIG. 20, each of the connectors 500d' includes, from bottom to top, a copper layer 502, a nickel layer 503, another copper layer 504 and a solder bump 505. Other types of connection structures can be used upon the process requirements.

In some embodiments, at least one of the semiconductor chips in the mentioned multi-chip wafer level packages 1 to 14 can be replaced by the semiconductor chip 500/500'/511/511' upon the process requirements. In some embodiments, the post-passivation interconnection structure PPI of the semiconductor chip 500/500'/511/511' may function as power lines, re-distribution lines (RDL), inductors, capacitors or any passive components and help to increase the process flexibility and improve the signal/power integrity.

In view of the above, in some embodiments of the present disclosure, at least one integrated passive device is disposed close to the active devices and these integrated passive and active devices are embedded in an integrated fan-out package structure by encapsulation layers. By such disposition, the package size can be significantly reduced, and the decoupling distance between the integrated passive device and the corresponding integrated active device can be greatly shortened. Besides, the pattern pitch of at least one of the redistribution layer structures can be accordingly increased. Therefore, the process window can be broadened and the production cost can be saved.

In accordance with some embodiments of the present disclosure, a multi-chip wafer level package includes a first tier and a second tier. The first tier includes a first redistribution layer structure and at least one chip over the first redistribution layer structure. The second tier includes a second redistribution layer structure and at least two other chips over the second redistribution layer structure. The first tier is bonded to the second tier with the at least one chip being in physical contact with the second redistribution layer structure. The total number of connectors of the at least two other chips is greater than the total number of connectors of the at least one chip.

In accordance with alternative embodiments of the present disclosure, a multi-chip wafer level package includes a first semiconductor chip, a second semiconductor chip, a second redistribution layer structure, a third semiconductor chip, a fourth semiconductor chip and a plurality of bumps. The first semiconductor chip is over a first side of first redistribution layer structure. The second semiconductor chip is aside the first semiconductor chip and over the first side of the first redistribution layer structure. The second redistribution layer structure is over the first semiconductor chip and the second semiconductor chip. The third semiconductor chip is over the second redistribution layer structure and electrically connected to the first semiconductor chip. The fourth semiconductor chip is over the second redistribution layer structure and electrically connected to the second and third semiconductor chips. The bumps are over a second side of the first redistribution layer structure opposite to the first side.

In accordance with yet alternative embodiments of the present disclosure, a method of forming multi-chip wafer level package that includes providing a carrier having a first redistribution layer structure formed thereon, placing a first integrated passive device chip and a second integrated passive device chip on a first side of the first redistribution layer structure, encapsulating the first integrated passive device chip and the second integrated passive device chip with a first encapsulation layer, forming a second redistribution layer structure on the first encapsulation layer, placing a first integrated active device chip and a second integrated active device chip on the second redistribution layer structure, encapsulating the first integrated active device chip and the second integrated active device chip with a second encapsulation layer, and debonding the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming multi-chip wafer level package, comprising:
   providing a carrier, the carrier having a first redistribution layer structure formed thereon;
   forming a chip module on a first side of the first redistribution layer structure, wherein forming the chip module comprises:
      forming a first integrated passive device chip and a second integrated passive device chip over the first side of the first redistribution layer structure; and
      forming a first integrated active device chip and a second integrated active device chip over the first integrated passive device chip and the second integrated passive device chip, respectively;
   forming at least one semiconductor chip over the first side of the first redistribution layer and adjacent to the chip module; and
   debonding the carrier.

2. The method of claim 1, wherein forming the chip module further comprises:
   forming a second redistribution layer structure between the first integrated passive device chip and the first integrated active device chip and between the second integrated passive device chip and the second integrated active device chip.

3. The method of claim 1, wherein forming the chip module further comprises:
   forming a first encapsulating layer to encapsulate the first integrated passive device chip and the second integrated passive device chip.

4. The method of claim 1, further comprising:
   forming a second encapsulation layer to encapsulae the chip module and the at least one semiconductor chip before debonding the carrier.

5. The method of claim 1, wherein forming the chip module further comprises:
forming an underfill layer to fill a space between the first redistribution layer structure and each of the chip module and the at least one semiconductor chip.

6. The method of claim 1, wherein the at least one semiconductor chip comprises an integrated passive device chip.

7. The method of claim 1, wherein the first integrated passive device chip and the first integrated active device chip are in a face-to-face configuration with substrates thereof away from each other, and the second integrated passive device chip and the second integrated active device chip are in a face-to-face configuration with substrates thereof away from each other.

8. A method of forming a multi-chip wafer level package, comprising:
providing a first carrier, the first carrier having a first redistribution layer structure formed thereon;
forming a chip module on a first side of the first redistribution layer structure, wherein forming the chip module comprises:
forming a plurality of first semiconductor chips and a plurality of second semiconductor chips alternately on a second carrier, wherein the plurality of first semiconductor chips are integrated passive device chips;
forming a second redistribution layer structure over the plurality of first semiconductor chips and the plurality of second semiconductor chips;
forming a plurality of third semiconductor chips and a plurality of fourth semiconductor chips alternately on the second redistribution layer structure;
debonding the second carrier; and
performing a singulation process to separate the chip module from another chip module;
forming a fifth semiconductor chip and a sixth semiconductor chip over the first side of the first redistribution layer and adjacent to the chip module; and
debonding the first carrier.

9. The method of claim 8, wherein forming the chip module further comprises:
forming a first underfill layer to fill a space between the second redistribution layer structure and each of the plurality of first semiconductor chips and the plurality of second semiconductor chips.

10. The method of claim 8, further comprising forming a second underfill layer to fill a space between the first redistribution layer structure and each of the chip module, the fifth semiconductor chip and the sixth semiconductor chip.

11. The method of claim 8, further comprising forming a plurality of bumps on a second side of the first redistribution layer opposite to the first side after debonding the first carrier.

12. The method of claim 8, wherein a critical dimension of the second redistribution layer structure is less than a critical dimension of the first redistribution layer structure.

13. The method of claim 8, wherein forming the chip module further comprises:
forming a first encapsulation layer to encapsulate the plurality of first semiconductor chips and the plurality of second semiconductor chips.

14. The method of claim 8, further comprising:
forming a second encapsulation layer to encapsulate the chip module, the fifth semiconductor chip and the sixth semiconductor chip.

15. A method of forming a multi-chip wafer level package, comprising:
providing a carrier having a first redistribution layer structure formed thereon;
placing a first semiconductor chip, an interposer and a second semiconductor chip on a first side of the first redistribution layer structure;
forming a first encapsulation layer to encapsulate the first semiconductor chip and the second semiconductor chip;
forming a second redistribution layer structure on the first encapsulation layer;
placing a third semiconductor chip and a fourth semiconductor chip on the second redistribution layer structure, wherein the third semiconductor chip is electrically connected to the fourth semiconductor chip through the interposer between the first semiconductor chip and the second semiconductor chip;
forming a second encapsulation layer to encapsulate the third semiconductor chip and the fourth semiconductor chip; and
debonding the carrier.

16. The method of claim 15, further comprising forming a plurality of bumps on a second side of the first redistribution layer structure opposite to the first side after debonding the carrier.

17. The method of claim 15, further comprising forming a fifth semiconductor chip and a sixth semiconductor chip on the first side of the first redistribution layer structure aside the first semiconductor chip and the second semiconductor chip before forming the second encapsulation layer, wherein the second encapsulation layer encapsulate the fifth semiconductor chip and the sixth semiconductor chip.

18. The method of claim 15, wherein at least one of the first semiconductor chip and the second semiconductor chip comprises an integrated passive device chip.

19. The method of claim 15, wherein at least one of the third semiconductor chip and the fourth semiconductor chip comprises an integrated active device chip.

20. The method of claim 15, wherein at least one of the fifth semiconductor chip and the sixth semiconductor chip comprises an integrated passive device chip.

* * * * *